(12) United States Patent
Shin et al.

(10) Patent No.: US 9,257,520 B2
(45) Date of Patent: Feb. 9, 2016

(54) SEMICONDUCTOR DEVICES INCLUDING A STRESSOR IN A RECESS AND METHODS OF FORMING THE SAME

(71) Applicants: Dong-Suk Shin, Yongin-si (KR); Hyun-Chul Kang, Seoul (KR); Dong-Hyun Roh, Suwon-si (KR); Pan-Kwi Park, Incheon (KR); Geo-Myung Shin, Seoul (KR); Nae-In Lee, Seoul (KR); Chul-Woong Lee, Suwon-si (KR); Hoi-Sung Chung, Suwon-si (KR); Young-Tak Kim, Hwaseong-si (KR)

(72) Inventors: Dong-Suk Shin, Yongin-si (KR); Hyun-Chul Kang, Seoul (KR); Dong-Hyun Roh, Suwon-si (KR); Pan-Kwi Park, Incheon (KR); Geo-Myung Shin, Seoul (KR); Nae-In Lee, Seoul (KR); Chul-Woong Lee, Suwon-si (KR); Hoi-Sung Chung, Suwon-si (KR); Young-Tak Kim, Hwaseong-si (KR)

(73) Assignee: Samsung Electronics Co, Ltd. (KR)

( * ) Notice: Subject to any disclaimer, the term of this patent is extended or adjusted under 35 U.S.C. 154(b) by 0 days.

(21) Appl. No.: 14/680,349

(22) Filed: Apr. 7, 2015

(65) Prior Publication Data

US 2015/0214329 A1 Jul. 30, 2015

Related U.S. Application Data

(63) Continuation of application No. 14/033,718, filed on Sep. 23, 2013, now Pat. No. 9,129,952.

(30) Foreign Application Priority Data

Nov. 22, 2012 (KR) .......... 10-2012-0133248
Jan. 4, 2013 (KR) .......... 10-2013-0001179

(51) Int. Cl.
*H01L 29/49* (2006.01)
*H01L 29/78* (2006.01)
(Continued)

(52) U.S. Cl.
CPC .... *H01L 29/4966* (2013.01); *H01L 21/823412* (2013.01); *H01L 21/823425* (2013.01); *H01L 29/6656* (2013.01); *H01L 29/6659* (2013.01);
(Continued)

(58) Field of Classification Search
CPC ............. H01L 29/4966; H01L 29/66492; H01L 21/823425; H01L 21/823412; H01L 29/6656; H01L 29/7848; H01L 29/66636; H01L 29/66628; H01L 29/66545
See application file for complete search history.

(56) References Cited

U.S. PATENT DOCUMENTS 7,064,039 B2   6/2006   Liu
7,354,835 B2   4/2008   Shin et al.
(Continued)

FOREIGN PATENT DOCUMENTS

JP   2009-117429   5/2009
JP   2009-123961   6/2009
(Continued)

*Primary Examiner* — William Coleman
(74) *Attorney, Agent, or Firm* — Myers Bigel Sibley & Sajovec, P.A.

(57) ABSTRACT

Semiconductor devices including a stressor in a recess and methods of forming the semiconductor devices are provided. The methods may include forming a trench in an active region and the trench may include a notched portion of the active region. The methods may also include forming an embedded stressor in the trench. The embedded stressor may include a lower semiconductor layer and an upper semiconductor layer, which has a width narrower than a width of the lower semiconductor layer. A side of the upper semiconductor layer may not be aligned with a side of the lower semiconductor layer and an uppermost surface of the upper semiconductor layer may be higher than an uppermost surface of the active region.

9 Claims, 41 Drawing Sheets

(51) Int. Cl.
*H01L 21/8234* (2006.01)
*H01L 29/66* (2006.01)

(52) U.S. Cl.
CPC .... *H01L 29/66492* (2013.01); *H01L 29/66628* (2013.01); *H01L 29/66636* (2013.01); *H01L 29/7836* (2013.01); *H01L 29/7848* (2013.01); *H01L 29/66545* (2013.01)

(56) References Cited

U.S. PATENT DOCUMENTS

| | | | |
|---|---|---|---|
| 7,538,387 B2 | 5/2009 | Tsai | |
| 7,557,396 B2 | 7/2009 | Ando | |
| 7,652,328 B2 | 1/2010 | Yamasaki et al. | |
| 7,683,405 B2 | 3/2010 | Son et al. | |
| 7,781,799 B2 | 8/2010 | Yu et al. | |
| 8,012,820 B2 | 9/2011 | Majumdar et al. | |
| 8,035,141 B2 | 10/2011 | Chan et al. | |
| 8,039,350 B2 | 10/2011 | Son et al. | |
| 8,062,948 B2 | 11/2011 | Shin | |
| 8,120,120 B2 | 2/2012 | Yang et al. | |
| 8,269,256 B2 | 9/2012 | Tamura | |
| 8,304,318 B2 | 11/2012 | Son et al. | |
| 2005/0148147 A1 | 7/2005 | Keating et al. | |
| 2006/0234455 A1 | 10/2006 | Chen et al. | |
| 2008/0242037 A1 | 10/2008 | Sell et al. | |
| 2008/0315254 A1 | 12/2008 | Fukuda et al. | |
| 2011/0024801 A1 | 2/2011 | Cheng et al. | |
| 2011/0024804 A1 | 2/2011 | Chang et al. | |
| 2011/0237039 A1 | 9/2011 | Yang et al. | |
| 2011/0316044 A1 | 12/2011 | Chan et al. | |
| 2012/0045878 A1 | 2/2012 | Tamura | |
| 2012/0058610 A1 | 3/2012 | Ookoshi et al. | |
| 2012/0094448 A1 | 4/2012 | Yeh et al. | |
| 2012/0100681 A1 | 4/2012 | Fang et al. | |
| 2012/0108021 A1 | 5/2012 | Mehrotra | |
| 2012/0146142 A1 | 6/2012 | Zhu et al. | |
| 2012/0164809 A1 | 6/2012 | Yoon et al. | |
| 2012/0205715 A1 | 8/2012 | Kwok et al. | |
| 2014/0141589 A1* | 5/2014 | Shin | H01L 29/66568 438/306 |

FOREIGN PATENT DOCUMENTS

JP  2011-151318  8/2011
KR  1020050005885  1/2005

* cited by examiner

SEMICONDUCTOR DEVICES INCLUDING A STRESSOR IN A RECESS AND METHODS OF FORMING THE SAME

CROSS-REFERENCE TO RELATED APPLICATIONS

This application is a continuation of U.S. application Ser. No. 14/033,718, filed Sep. 23, 2013 in the United States Patent and Trademark Office and claims the benefit of Korean Patent Application No. 10-2012-0133248, filed on Nov. 22, 2012, and Korean Patent Application No. 10-2013-0001179, filed on Jan. 4, 2013, in the Korean Intellectual Property Office, the disclosures of which are incorporated by reference herein in their entireties.

FIELD

The present disclosure generally relates to the field of electronics, and more particularly, to semiconductor devices.

BACKGROUND

To improve electrical characteristics of semiconductor devices, a variety of strain technologies have been developed.

SUMMARY

A semiconductor device may include a substrate including an active region, a gate electrode on the active region, and a trench in the active region adjacent a side of the gate electrode. The trench may include a notched portion of the active region. The semiconductor device may also include an embedded stressor in the trench. The embedded stressor may include a lower semiconductor layer and an upper semiconductor layer on the lower semiconductor layer. The upper semiconductor layer may have a first width narrower than a second width of the lower semiconductor layer, and alignment of a side surface of the upper semiconductor layer may be offset from an outer side surface of the lower semiconductor layer. An uppermost surface of the upper semiconductor layer may be higher than an uppermost surface of the active region.

According to various embodiments, the lower semiconductor layer may include a silicon germanium layer and the upper semiconductor layer may include a silicon layer or a silicon germanium layer. A germanium concentration of the lower semiconductor layer may be greater than a germanium concentration of the upper semiconductor layer.

In various embodiments, the lower semiconductor layer may include a first semiconductor layer and a second semiconductor layer between a surface of the trench and the first semiconductor layer. The first semiconductor layer may include boron and germanium. A germanium concentration of the first semiconductor layer may be greater than a germanium concentration of the second semiconductor layer.

According to various embodiments, a lowermost portion of the upper semiconductor layer may be lower than an uppermost surface of the lower semiconductor layer and the uppermost surface of the lower semiconductor layer may be higher than the uppermost surface of the active region. The lower semiconductor layer may contact a side and a bottom of the upper semiconductor layer.

According to various embodiments, the semiconductor device may further include a spacer between the upper semiconductor layer and the gate electrode. The lower semiconductor layer may contact a side and a bottom of the spacer, and the upper semiconductor layer may be spaced apart from the spacer.

In various embodiments, the semiconductor device may further include an additional spacer between the upper semiconductor layer and the gate electrode. The additional spacer may contact an uppermost surface of the lower semiconductor layer and a side of the upper semiconductor layer. A lowermost portion of the upper semiconductor layer may be lower than a lowermost surface of the additional spacer.

According to various embodiments, the semiconductor device may further include a lightly doped drain (LDD) in the active region adjacent the side of the gate electrode. The LDD may include boron and phosphorous, and a phosphorous concentration of the LDD may be in a range of about 5E18 atoms/cm$^3$ to about 1E19 atoms/cm$^3$.

According to various embodiments, the semiconductor device may further include a lightly doped drain (LDD) in the active region adjacent the side of the gate electrode and a fast etching region between the LDD and the embedded stressor. The fast etching region may include phosphorous.

A semiconductor device may include a substrate including first and second regions, a first gate electrode on a first active region in the first region, a first spacer on a side of the first gate electrode, a first additional spacer on the first spacer, a first trench in the first active region adjacent the side of the first gate electrode, and a first embedded stressor in the first trench. The semiconductor device may also include a second gate electrode on a second active region in the second region, a second spacer on a side of the second gate electrode, a second additional spacer on the second spacer, a second trench in the second active region adjacent the side of the second gate electrode, and a second embedded stressor in the second trench. The first and second regions may include different respective pattern densities. The first embedded stressor may include a first upper semiconductor layer and a first lower semiconductor layer between a surface of the first trench and the first upper semiconductor layer. A lowermost portion of the first upper semiconductor layer may be lower than an uppermost surface of the first lower semiconductor layer. The second embedded stressor may include a second upper semiconductor layer and a second lower semiconductor layer between a surface of the second trench and the second upper semiconductor layer. The first upper semiconductor layer may have a first thickness greater than a second thickness of the second upper semiconductor layer.

According to various embodiments, a first vertical distance between the uppermost surface of the first lower semiconductor layer and an uppermost surface of the second lower semiconductor layer may be greater than a second vertical distance between an uppermost surface of the first upper semiconductor layer and an uppermost surface of the second upper semiconductor layer.

In various embodiments, a first width of the first trench may be narrower than a second width of the second trench.

According to various embodiments, the first trench may include a first notched portion of the first active region and the second trench may include a second notched portion of the second active region.

In various embodiments, an uppermost surface of the second lower semiconductor layer may be higher than the uppermost surface of the first lower semiconductor layer.

In various embodiments, the first lower semiconductor layer may contact a side and a lower surface of the first spacer, the uppermost surface of the first lower semiconductor layer may contact a lower surface of the first additional spacer, and a side of the first upper semiconductor layer may contact a side of the first additional spacer. The second lower semiconductor layer may contact a side and a lower surface of the second spacer, an uppermost surface of the second lower semiconductor layer may contact a lower surface of the second additional spacer, and a side of the second upper semiconductor layer may contact a side of the second additional spacer.

A method of forming a semiconductor device may include forming a lightly doped drain (LDD) in an active region in a substrate, forming a fast etching region including phosphorous in the LDD, forming a first trench in the active region by recessing the fast etching region and forming a second trench in the active region by enlarging the first trench using a directional etch process. The second trench may include a notched portion of the active region. The method may also include forming an embedded stressor in the second trench and forming a gate electrode on the active region. The embedded stressor may include a lower semiconductor layer and an upper semiconductor layer. The upper semiconductor layer may have a first width narrower than a second width of the lower semiconductor layer, and alignment of a side surface of the upper semiconductor layer may be offset from an outer side surface of the lower semiconductor layer. An uppermost surface of the upper semiconductor layer may be higher than an uppermost surface of the active region.

According to various embodiments, the method may further include forming a spacer between the upper semiconductor layer and the gate electrode. The spacer may contact an uppermost surface of the lower semiconductor layer and a side of the upper semiconductor layer.

In various embodiments, forming the embedded stressor may include forming the lower semiconductor layer in the second trench, forming the spacer on the lower semiconductor layer and forming the upper semiconductor layer contacting a side of the spacer on the lower semiconductor layer. Before forming the upper semiconductor layer, forming a recess in the lower semiconductor layer may be additionally performed. Forming the recess may include etching the lower semiconductor layer using the spacer as an etch mask, and at least a portion of the upper semiconductor layer is in the recess.

A method of forming a semiconductor device may include forming a first gate electrode on a first active region in a first region of a substrate and a second gate electrode on a second active region in a second region of the substrate. The first and second regions may include different respective pattern densities. The method may also include forming a first spacer on a side of the first gate electrode and a second spacer on a side of the second gate electrode, forming a first additional spacer on the first spacer and a second additional spacer on the second spacer, forming a first trench in the first active region adjacent the side of the first gate electrode and a second trench in the second active region adjacent the side of the second gate electrode and forming a first embedded stressor in the first trench and a second embedded stressor in the second trench. The first embedded stressor may include a first lower semiconductor layer and a first upper semiconductor layer on the first lower semiconductor layer. A lowermost portion of the first upper semiconductor layer may be lower than an uppermost surface of the first lower semiconductor layer. The second embedded stressor may include a second lower semiconductor layer and a second upper semiconductor layer on the second lower semiconductor layer. The first upper semiconductor layer may include a first thickness greater than a second thickness of the second upper semiconductor layer.

A semiconductor device may include an active region in a substrate, a gate electrode on the active region, and a cavity in the active region adjacent a side of the gate electrode. The cavity may include a notched portion of the active region. The semiconductor device may also include a stressor including a lower layer at least partially in the cavity and an upper layer on the lower layer. An uppermost surface of the lower layer may be higher than an uppermost surface of the active region and an uppermost surface of the upper layer may be higher than the uppermost surface of the active region. The upper layer may expose portions of the lower layer adjacent opposing sidewalls of the upper layer when viewed in cross section.

According to various embodiments, a portion of the lower layer may be in the notched portion, and the gate electrode may at least partially overlap the portion of the lower layer in the notched portion.

In various embodiments, the semiconductor device may further include a spacer on the side of the gate electrode. The lower layer may be on respective portions of a lower surface and a side of the spacer.

According to various embodiments, the semiconductor device may further include a spacer on the side of the gate electrode. The spacer may contact the uppermost surface of the lower layer and a side of the upper layer.

In various embodiments, the lower layer may include silicon germanium and the upper layer may include silicon or silicon germanium, and a germanium concentration of the lower layer may be greater than a germanium concentration of the upper layer.

According to various embodiments, the lower layer may include a first stressor layer lining a surface of the cavity and a second stressor layer on the first stressor layer. The second stressor layer may include germanium and a germanium concentration of the second stressor layer may be greater than a germanium concentration of the first stressor layer.

According to various embodiments, an upper surface of the lower layer may include a recess and at least a portion of the upper layer may be in the recess. A surface of the recess may include a curved shape. The semiconductor device may further include a spacer on the side of the gate electrode, and a side and a lowermost surface of the spacer may contact the upper layer.

In various embodiments, the semiconductor device may further include a lightly doped drain (LDD) in the active region adjacent the side of the gate electrode. The LDD may include boron and phosphorous. A portion of the lower layer may be in the notched portion and the LDD may contact the portion of the lower layer in the notched portion. The semiconductor device may further include a doped region between the stressor and the LDD. The doped region may include phosphorous, and a phosphorous concentration of the doped region may be greater than a phosphorous concentration of the LDD. A phosphorous concentration of the LDD may be in a range of about 5E18 atoms/cm3 to about 1E19 atoms/cm$^3$.

DETAILED DESCRIPTION

Figure 1:
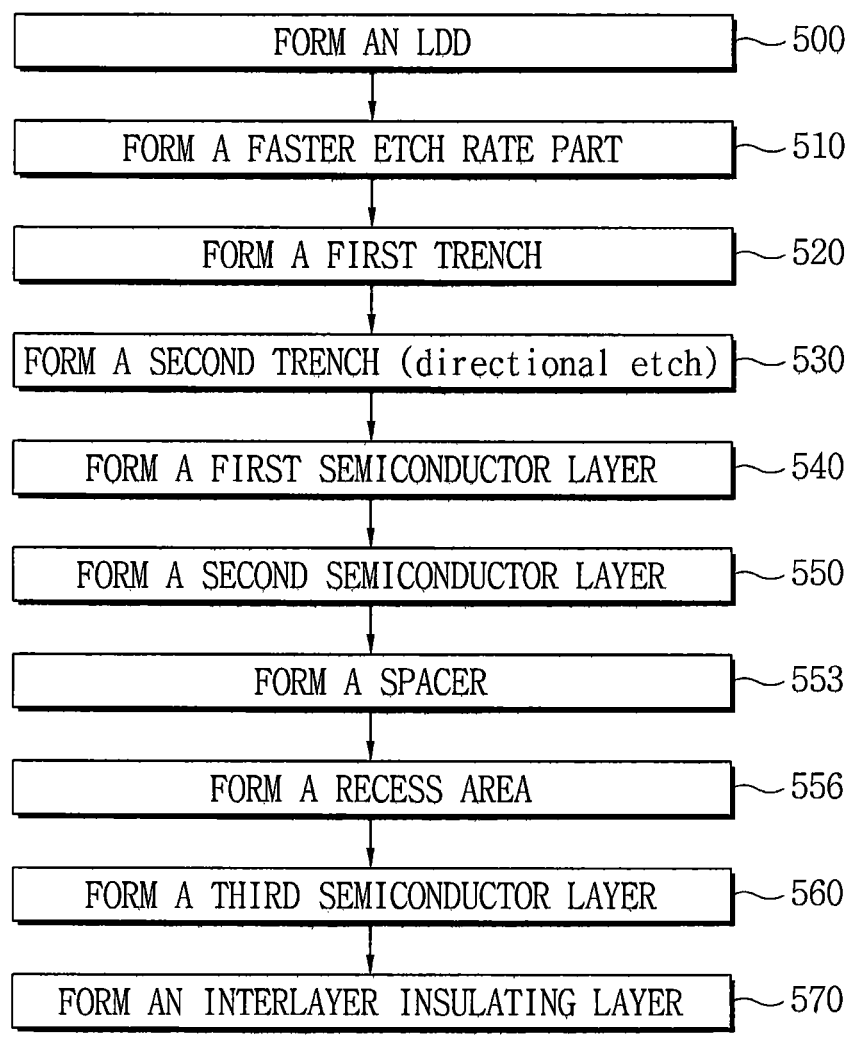
FIG. 1 is a flowchart illustrating a method of forming a semiconductor device according to some embodiments of the present inventive concepts.

Example embodiments are described below with reference to the accompanying drawings. Many different forms and embodiments are possible without deviating from the spirit and teachings of this disclosure and so the disclosure should not be construed as limited to the example embodiments set forth herein. Rather, these example embodiments are provided so that this disclosure will be thorough and complete, and will convey the scope of the disclosure to those skilled in the art. In the drawings, the sizes and relative sizes of layers and regions may be exaggerated for clarity. Like reference numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements. Other words used to describe relationships between elements should be interpreted in a like fashion (i.e., "between" versus "directly between," "adjacent" versus "directly adjacent," etc.).

It will be understood that, although the terms first, second, A, B, etc. may be used herein in reference to elements of the invention, such elements should not be construed as limited by these terms. For example, a first element could be termed a second element, and a second element could be termed a first element, without departing from the scope of the present invention. Herein, the term "and/or" includes any and all combinations of one or more referents.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein to describe embodiments of the invention is not intended to limit the scope of the invention. The articles "a," "an," and "the" are singular in that they have a single referent, however the use of the singular form in the present document should not preclude the presence of more than one referent. In other words, elements of the invention referred to in the singular may number one or more, unless the context clearly indicates otherwise. It will be further understood that the terms "comprises," "comprising," "includes," and/or "including," when used herein, specify the presence of stated features, items, steps, operations, elements, and/or components, but do not preclude the presence or addition of one or more other features, items, steps, operations, elements, components, and/or groups thereof.

Embodiments are described herein with reference to cross-sectional illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concepts.

Unless otherwise defined, all terms (including technical and scientific terms) used herein are to be interpreted as is customary in the art to which this invention belongs. It will be further understood that terms in common usage should also be interpreted as is customary in the relevant art and not in an idealized or overly formal sense unless expressly so defined herein.

It should also be noted that in some alternate implementations, the functions/acts noted in flowchart blocks herein may occur out of the order noted in the flowcharts. For example, two blocks shown in succession may in fact be executed substantially concurrently or the blocks may sometimes be executed in the reverse order, depending upon the functionality/acts involved. Moreover, the functionality of a given block of the flowcharts and/or block diagrams may be separated into multiple blocks and/or the functionality of two or more blocks of the flowcharts and/or block diagrams may be at least partially integrated. Finally, other blocks may be added or inserted between the blocks that are illustrated, and/or blocks/operations may be omitted without departing from the scope of the present inventive concepts.

Although a transistor including a stressor in a recess may improve carrier mobility, there may be large variations in sizes and shapes of recesses within a device. Various embodiments of the present inventive concepts, however, provide methods of forming a semiconductor device, the methods including forming a faster etch rate part which may enable control of a size and a shape of a recess. Accordingly, the methods described herein may reduce variations in sizes and shapes of recesses within a device.

FIG. 1 is a flowchart illustrating a method of forming a semiconductor device according to some embodiments of the present inventive concepts. FIGS. 2-4, 5A-5C, 6A-6C, 7A-7C, 8-10, 11A, 11B, 12A, 12B, 13-15 and 16A-16E are cross-sectional views illustrating intermediate structures provided in operations of forming a semiconductor device according to some embodiments of the present inventive concepts.

Referring to FIG. 1, a method of forming a semiconductor device according to some embodiments of the present inventive concepts may include forming a lightly doped drain (LDD) (Block 500), forming a faster etch rate part (Block 510), forming a first trench (Block 520), forming a second trench (Block 530), forming a first semiconductor layer (Block 540), forming a second semiconductor layer (Block 550), forming a spacer (Block 553), forming a recess area (Block 556), forming a third semiconductor layer (Block 560), and forming an interlayer insulating layer (Block 570).

In some embodiments, forming the recess area (Block 556) may be omitted. For example, the methods of forming a semiconductor device according to some embodiments of the present inventive concepts may include forming the lightly doped drain (LDD) (Block 500), forming the faster etch rate part (Block 510), forming the first trench (Block 520), forming the second trench (Block 530), forming the first semiconductor layer (Block 540), forming the second semiconductor layer (Block 550), forming the spacer (Block 553), forming the third semiconductor layer (Block 560), and forming the interlayer insulating layer (Block 570).

Figure 2:
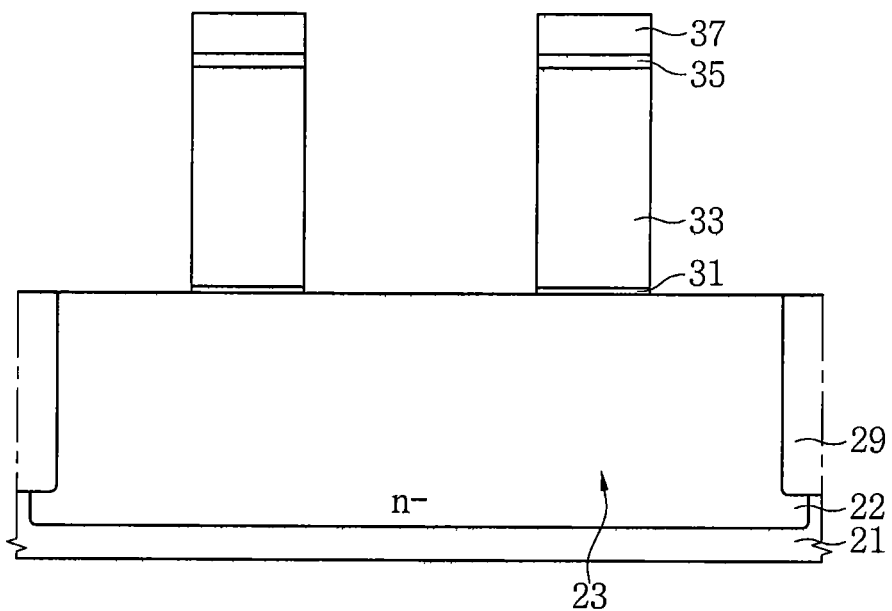
FIGS. 2-4, 5A-5C, 6A-6C, 7A-7C, 8-10, 11A, 11B, 12A, 12B, 13-15 and 16A-16E are cross-sectional views illustrating intermediate structures provided in operations of forming a semiconductor device according to some embodiments of the present inventive concepts.

Referring to FIGS. 1 and 2, a well 22, an active region 23, a device isolation layer 29, a buffer layer 31, a preliminary gate electrode 33, a first mask pattern 35, and a second mask pattern 37 may be formed on a substrate 21. The substrate 21 may be a single-crystalline semiconductor substrate such as a silicon wafer or a silicon on insulator (SOI) wafer. The substrate 21 may include first conductivity-type impurities. The well 22 may include second conductivity-type impurities different from the first conductivity-type impurities.

Hereinafter, the description will be made under the assumption that the first conductivity-type is p-type, and the second conductivity-type is n-type. In some embodiments, however, the first conductivity-type may be n-type, and the second conductivity type may be p-type. For example, the substrate 21 may be single crystalline silicon including p-type impurities, and the well 22 may be single crystalline silicon including n-type impurities. The substrate 21 may include boron (B), and the well 22 may include As, P, or a combination thereof.

The active region 23 may be confined to the well 22 by the device isolation layer 29. The active region 23 may include single crystalline silicon including n-type impurities. The device isolation layer 29 may be formed using a shallow trench isolation (STI) technique. The device isolation layer 29 may include an insulating layer such as silicon oxide, silicon nitride, silicon oxy-nitride, or a combination thereof. The buffer layer 31 may be interposed between the active region 23 and the preliminary gate electrode 33. The buffer layer 31 may include an insulating layer such as silicon oxide, silicon nitride, silicon oxy-nitride, or a combination thereof. For example, the buffer layer 31 may be silicon oxide.

The preliminary gate electrode 33 may be formed to cross the active region 23. The preliminary gate electrode 33 may cross the active region 23 and the device isolation layer 29. The preliminary gate electrode 33 may include polysilicon. In some embodiments, the preliminary gate electrode 33 may include an insulating layer. The first mask pattern 35 may be formed on the preliminary gate electrode 33. The first mask pattern 35 may include a material having an etch selectivity with respect to the preliminary gate electrode 33. The second mask pattern 37 may be formed on the first mask pattern 35. The second mask pattern 37 may include a material having an etch selectivity with respect to the first mask pattern 35. For example, the first mask pattern 35 may include silicon oxide, and the second mask pattern 37 may include silicon nitride or polysilicon. In some embodiments, one of the first mask pattern 35 and the second mask pattern 37 may be omitted.

Sides of the second mask pattern 37, first mask pattern 35, preliminary gate electrode 33, and buffer layer 31 may be vertically aligned. The second mask pattern 37, the first mask pattern 35, the preliminary gate electrode 33, and the buffer layer 31 may be referred to as a preliminary gate pattern 31, 33, 35, and 37. The preliminary gate pattern 31, 33, 35, and 37 may cross the active region 23. A plurality of the preliminary gate patterns 31, 33, 35, and 37 may be formed in parallel on the active region 23.

Figure 3:
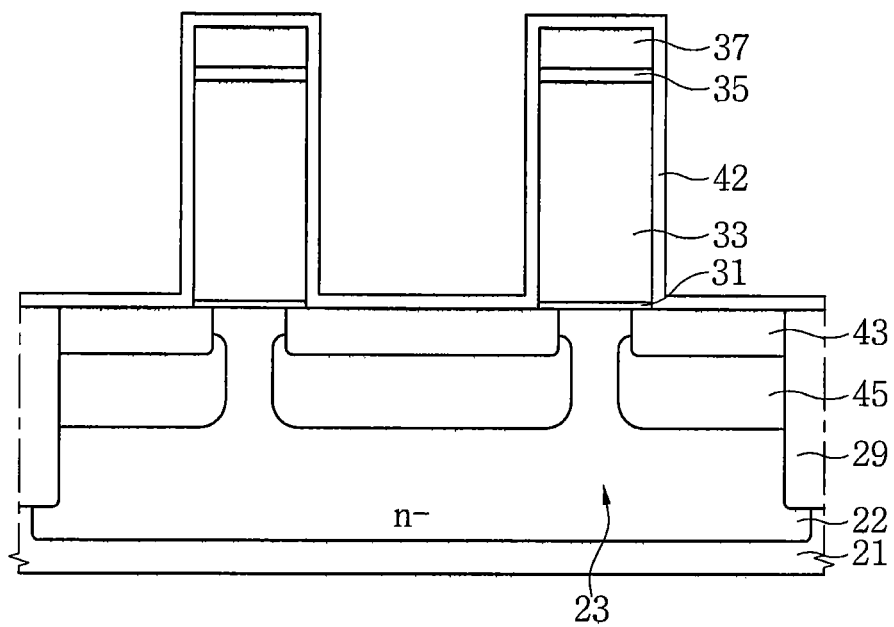

Referring to FIGS. 1 and 3, a first spacer 42 may be formed on a sidewall of the preliminary gate electrode 33. A lightly doped drain (LDD) 43 may be formed by implanting the first conductivity-type impurities in the active region 23 using the first spacer 42, the second mask pattern 37, the first mask pattern 35, and the preliminary gate electrode 33 as an ion-implantation mask (Block 500). For example, the formation of the LDD 43 may be performed at a dose of 1E13 to 5E14 atoms/cm$^2$ of $BF_2$ and an ion-implantation energy of 2 to 5 KeV. The LDD 43 may include boron. A halo 45 may be formed by implanting the second conductivity-type impurities to the active region 23. The halo 45 may cover a side and a bottom of the LDD 43. The formation of the LDD 43 and the halo 45 may include an ion-implantation process and a heat treatment process.

The first spacer 42 may conformally cover an upper surface of the substrate 21. For example, the first spacer 42 may cover upper and side surfaces of the preliminary gate pattern 31, 33, 35, and 37, and cover the active region 23 and the device isolation layer 29 with a constant thickness. The first spacer 42 may include an insulating layer such as silicon oxide, silicon nitride, silicon oxy-nitride, or a combination thereof. The first spacer 42 may include a material having an etch selectivity with respect to the preliminary gate electrode 33. For example, the first spacer 42 may include silicon nitride. The LDD 43 may be formed to reach a certain depth from an upper surface of the active region 23. The LDD 43 may be partially overlapped by a bottom of the preliminary gate pattern 31, 33, 35, and 37. The LDD 43 may be formed at a desired position by adjusting the thickness of the first spacer 42.

Figure 4:
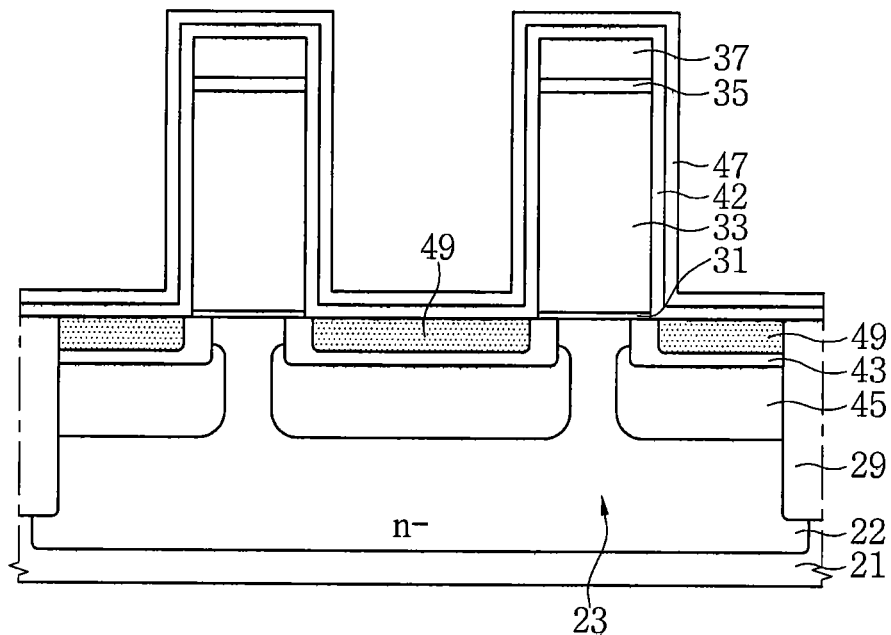

Referring to FIGS. 1 and 4, a second spacer 47 may be formed on the first spacer 42. A faster etch rate part 49 may be formed in the active region 23 using the second spacer 47 as an ion-implantation mask (Block 510). For example, the formation of the faster etch rate part 49 may be performed at a dose of 5E14 to 3E15 atoms/cm$^2$ of $PH_3$ and an ion-implantation energy of 2 to 5 KeV. $PH_2$ may be used instead of the $PH_3$. The faster etch rate part 49 may include phosphorous (P).

The second spacer 47 may conformally cover the substrate 21. For example, the second spacer 47 may cover upper and side surfaces of the preliminary gate pattern 31, 33, 35, and 37, and cover the LDD 43 and the device isolation layer 29. The second spacer 47 may include an insulating layer such as silicon oxide, silicon nitride, silicon oxy-nitride, or a combination thereof. The second spacer 47 may include a material having an etch selectivity with respect to the preliminary gate electrode 33. For example, the second spacer 47 may include silicon nitride. The first spacer 42 and the second spacer 47 may sequentially cover the side surface of the preliminary gate pattern 31, 33, 35, and 37.

The faster etch rate part 49 may be formed at a desired position by adjusting the thickness of the second spacer 47.

The faster etch rate part 49 may be formed in the LDD 43. A bottom of the faster etch rate part 49 may be formed at a higher level than a bottom of the LDD 43. The preliminary gate electrode 33 may be formed not to overlap the faster etch rate part 49. The active region 23 may be retained under the preliminary gate electrode 33. The LDD 43 may be retained under the preliminary gate electrode 33. The LDD 43 may be retained between the faster etch rate part 49 and the active region 23.

In some embodiments, the faster etch rate part 49 may pass through the LDD 43. For example, the bottom of the faster etch rate part 49 may be formed in the halo 45. Further, the faster etch rate part 49 may pass through both of the LDD 43 and the halo 45.

Figure 5A:
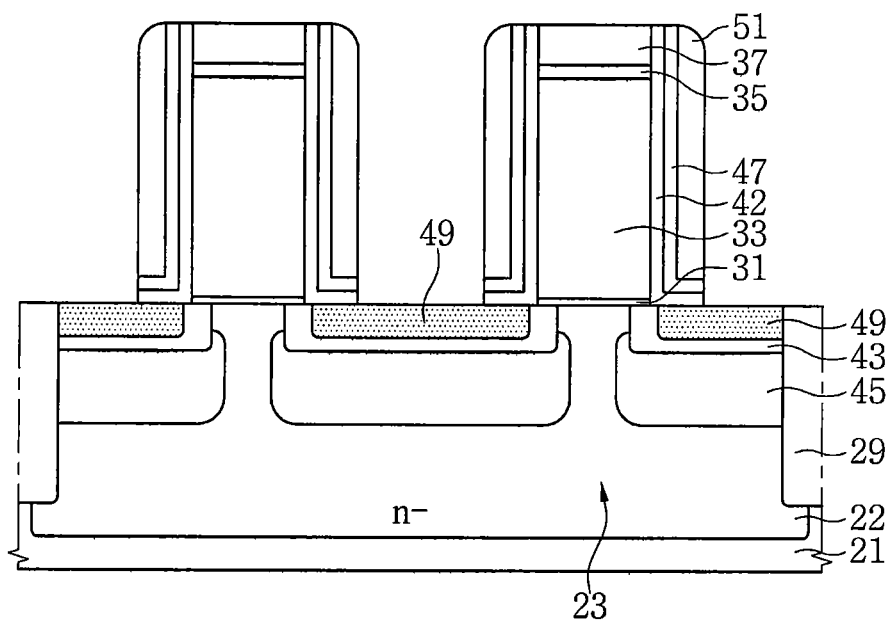

Referring to FIGS. 1 and 5A, a third spacer 51 may be formed on the second spacer 47. The formation of the third spacer 51 may include a thin-film formation process and an anisotropic etching process. During the formation of the third spacer 51, the second spacer 47 and the first spacer 42 may be partially removed to expose an upper surface of the faster etch rate part 49. The second spacer 47 and the first spacer 42 may be retained between the preliminary gate pattern 31, 33, 35, and 37 and the third spacer 51.

The third spacer 51 may include an insulating material such as silicon oxide, silicon nitride, silicon oxy-nitride, or a combination thereof. The third spacer 51 may include a material having an etch selectivity with respect to the preliminary gate electrode 33. For example, the third spacer 51 may include silicon nitride.

Figure 5B:
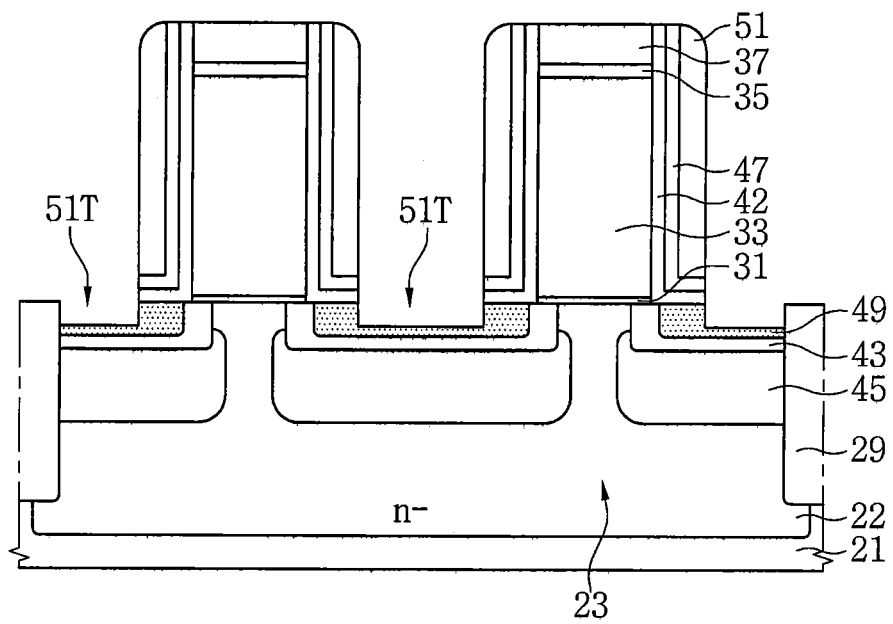

Referring to FIGS. 1 and 5B, during the formation of the third spacer 51, the faster etch rate part 49 may be partially removed to form a first recess area 51T. For example, the first recess area 51T may have a depth of 1 nm to 10 nm.

Figure 5C:
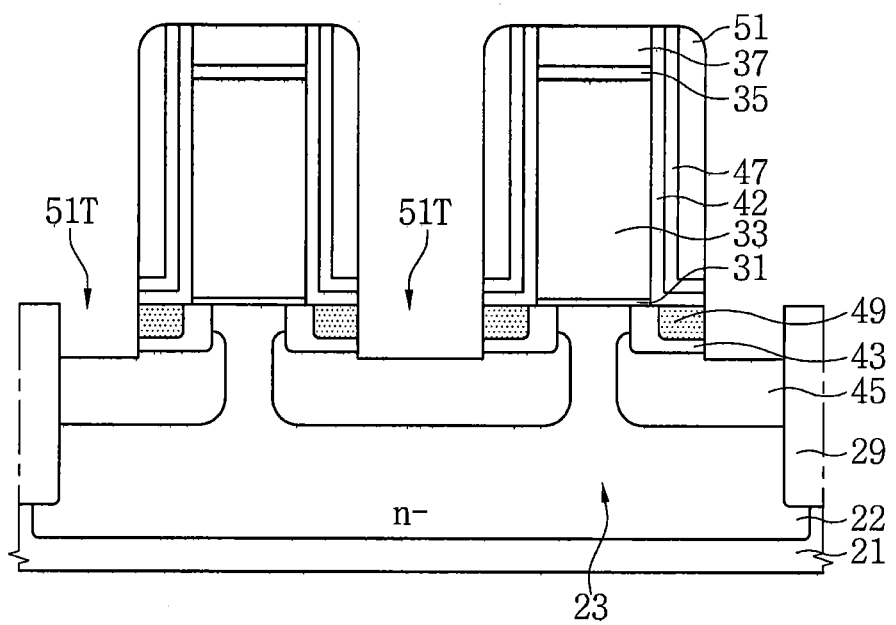

Referring to FIGS. 1 and 5C, after the formation of the third spacer 51, the first recess area 51T may be formed using an additional anisotropic etching process. The first recess area 51T may pass through the faster etch rate part 49 and the LDD 43. For example, the first recess area 51T may have a depth of 7 nm to 10 nm. A bottom of the first recess area 51T may expose the halo 45. Sidewalls of the first recess area 51T may be vertically aligned with side surfaces of the third spacer 51.

Figure 6A:
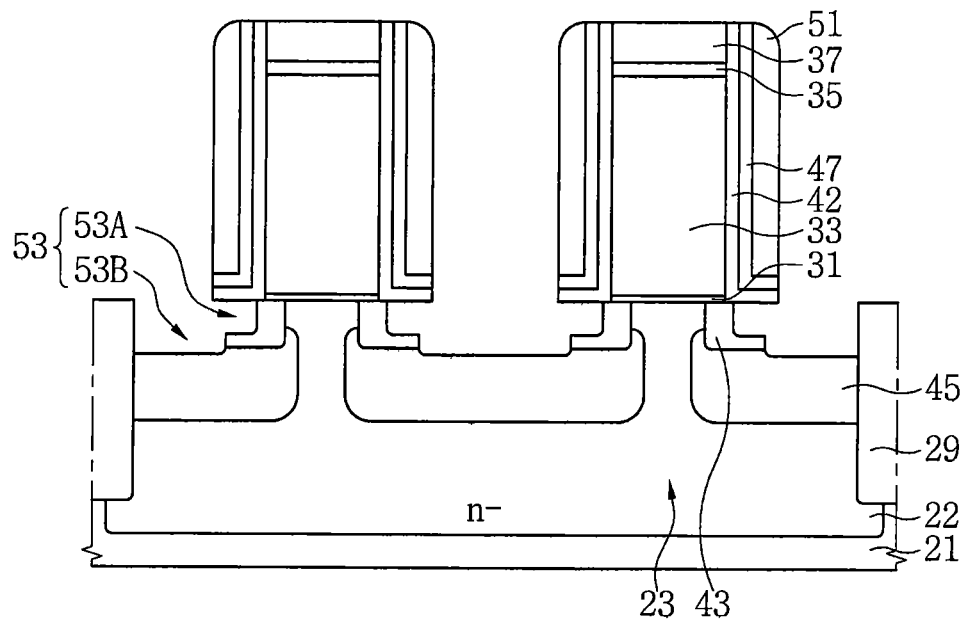
Figure 6B:
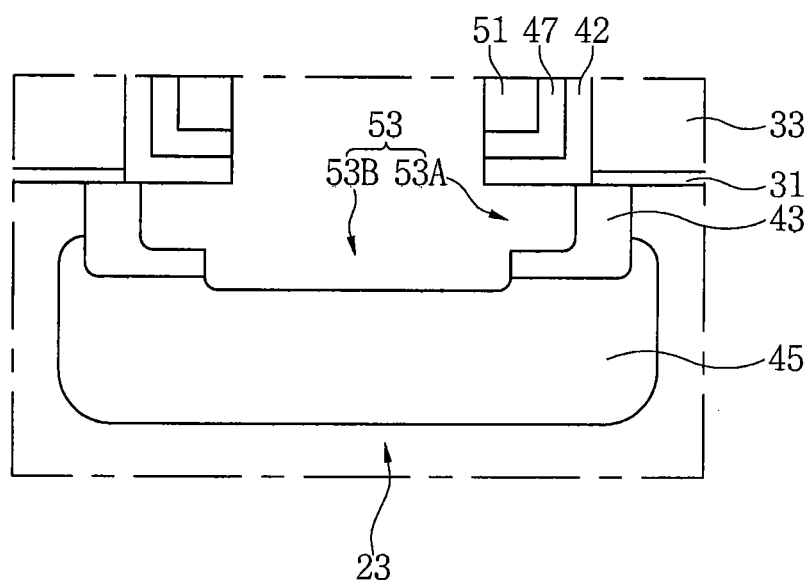

Referring to FIGS. 1, 6A, and 6B, the faster etch rate part 49, the LDD 43, and the halo 45 may be etched to form a first trench 53 (Block 520). The first trench 53 may include an upper trench 53A aligned with the faster etch rate part 49, and a lower trench 53B connected to a bottom of the upper trench 53A. The upper trench 53A may be formed in the LDD 43. Due to the upper trench 53A, an under-cut may be formed under the first spacer 42, the second spacer 47, and the third spacer 51. The lower trench 53B may pass through the LDD 43 to be formed in the halo 45. The lower trench 53B may have a width smaller than a width of the upper trench 53A. A sidewall of the first trench 53 may have a step. For example, a side surface of the LDD 43, which is exposed by the upper trench 53A and lower trench 53B, may have a step.

The formation of the first trench 53 may include a dry-etch process, a wet-etch process, or a combination thereof. The formation of the first trench 53 may include an isotropic etch process, an anisotropic etch process, or a combination thereof. For example, the formation of the first trench 53 may include an isotropic dry-etch process using HBr, $CF_4$, $O_2$, $Cl_2$, $NF_3$, or a combination thereof. According to some embodiments, single crystalline silicon containing phosphorous (P), which has an etch rate higher than that of single crystalline silicon containing boron (B), may be included in the faster etch rate part 49, and thus the faster etch rate part 49 may have an etch rate higher than that of the LDD 43. Depending on the configuration of the faster etch rate part 49 and the LDD 43, the sizes and shapes of the upper trench 53A and lower trench 53B may be determined. The size, the shape, and the location of the first trench 53 may be controlled as desired, using the configuration of the faster etch rate part 49 and the LDD 43. The first trench 53 may be uniformly formed over the entire surface of the substrate 21.

Figure 6C:
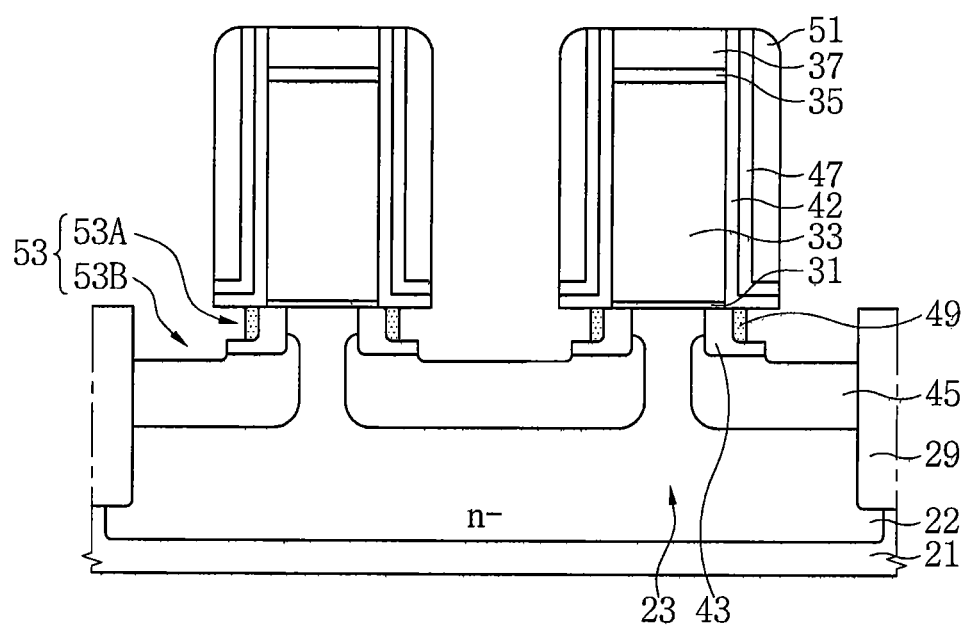

Referring to FIG. 6C, in some embodiments, the faster etch rate part 49 may be retained between the upper trench 53A and the LDD 43.

Figure 7A:
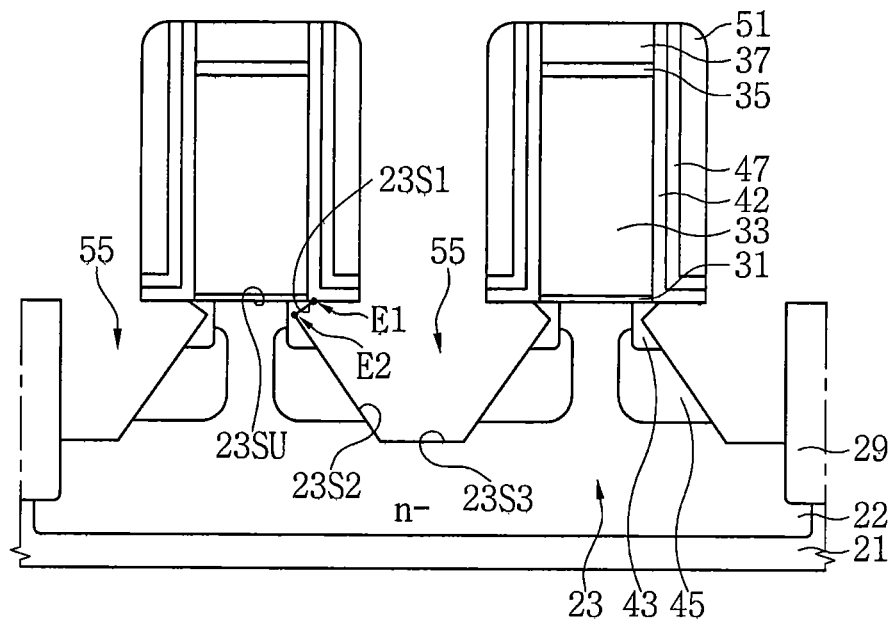

Referring to FIGS. 1 and 7A, a second trench 55 may be formed using a directional etch process (Block 530). For example, the formation of the second trench 55 may include a wet-etch process using $NH_4OH$, $NH_3OH$, TMAH (Tetra Methyl Ammonium Hydroxide), KOH, NaOH, BTMH (benzyltrimethylammonium hydroxide), or a combination thereof. The active region 23 may have a sigma shape (Σ-shape) due to the second trench 55. The LDD 43 may be retained under the preliminary gate pattern 31, 33, 35, and 37. The active region 23 may include a first surface 23SU, a first side surface 23S1, a second side surface 23S2, and a second surface 23S3. A first edge E1 may be defined between the first side surface 23S1 and the first surface 23SU. A second edge E2 may be defined between the first side surface 23S1 and the second side surface 23S2. In some embodiments, each of the first side surface 23S1 and the second side surface 23S2 may include a {111} crystal plane. The second trench 55 may be interpreted as an extension of the first trench 53.

Figure 7B:
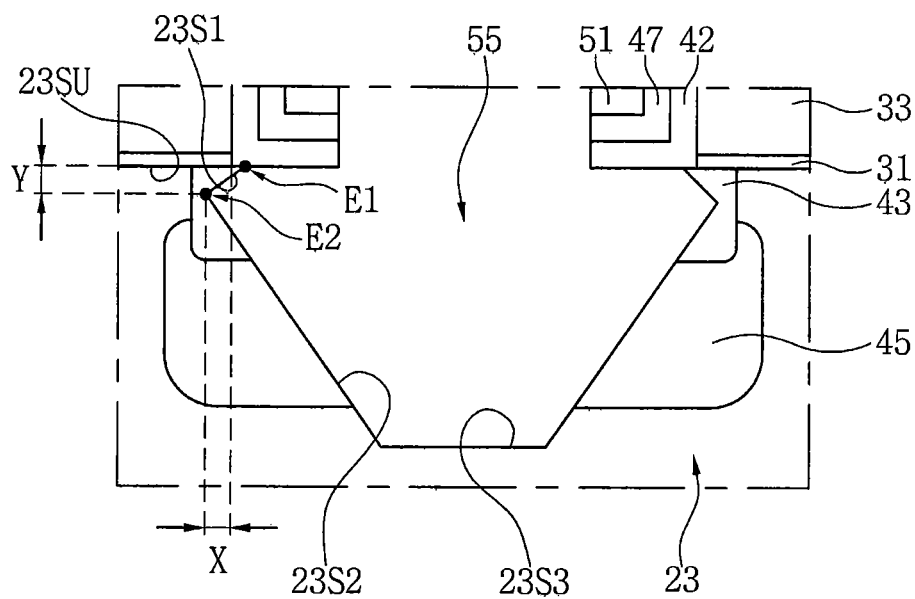

Referring to FIG. 7B, the second trench 55 may pass through the LDD 43 and the halo 45. The first surface 23SU may be defined on an upper end of the active region 23. For example, the first surface 23SU may be in contact with the buffer layer 31 and extend below the first spacer 42. The second trench 55 may expose the first side surface 23S1, the second side surface 23S2, and the second surface 23S3. The first side surface 23S1 may be connected to the first surface 23SU. The first side surface 23S1 may form an acute angle with respect to the first surface 23SU. The second side surface 23S2 may be formed under the first side surface 23S1. The second side surface 23S2 may have a different angle from the first side surface 23S1. The second side surface 23S2 may form an acute angle with respect to a horizontal extension line, which is parallel to the substrate 21 and passes through the second surface 23S3. A bottom of the second trench 55 may expose the second surface 23S3. The second surface 23S3 may be connected to the second side surface 23S2. The first surface 23SU may be interpreted as an upper surface of the active region 23.

The first edge E1 and the second edge E2 may be formed at a desired position by controlling the location of the faster etch rate part 49. For example, the first edge E1 may be formed under the first spacer 42, and the second edge E2 may be formed to be overlapped by a bottom of the preliminary gate electrode 33. The first edge E1 and the second edge E2 may be located on a surface of the LDD 43. The first side surface 23S1 may expose the LDD 43. The second side surface 23S2 may expose the LDD 43, the halo 45, and the active region 23.

A horizontal distance X may be defined between the second edge E2 and a straight line, which passes through a side surface of the preliminary gate electrode 33 and is perpendicular to the substrate 21. A vertical distance Y may be defined between the second edge E2 and a straight line, which passes through the first surface 23SU and is parallel to the substrate 21. For example, the horizontal distance X may be from zero to −5 nm, and the vertical distance Y may be from 3 nm to 7 nm. When the horizontal distance X is zero, it may be understood that the second edge E2 is vertically overlapped by the side surface of the preliminary gate electrode 33, and when the horizontal distance X is a negative (−) value, it may be understood that the second edge E2 is vertically overlapped by the bottom of the preliminary gate electrode 33. In addition, when the horizontal distance X is a positive (+) value, it may be understood that the preliminary gate electrode 33 does not overlap the second edge E2.

The horizontal distance X and the vertical distance Y may be uniformly controlled over the entire surface of the substrate 21 by adjusting the location of the faster etch rate part 49. In some embodiments, it is possible to relatively decrease the vertical distance Y while increasing the absolute value of the horizontal distance X. A semiconductor device according to some embodiments of the present inventive concepts may have good electrical characteristics according to the horizontal distance X and the vertical distance Y. According to some embodiments, a semiconductor device that includes the second edge E2 located on the surface of the LDD 43 may show good electrical characteristics.

Figure 7C:
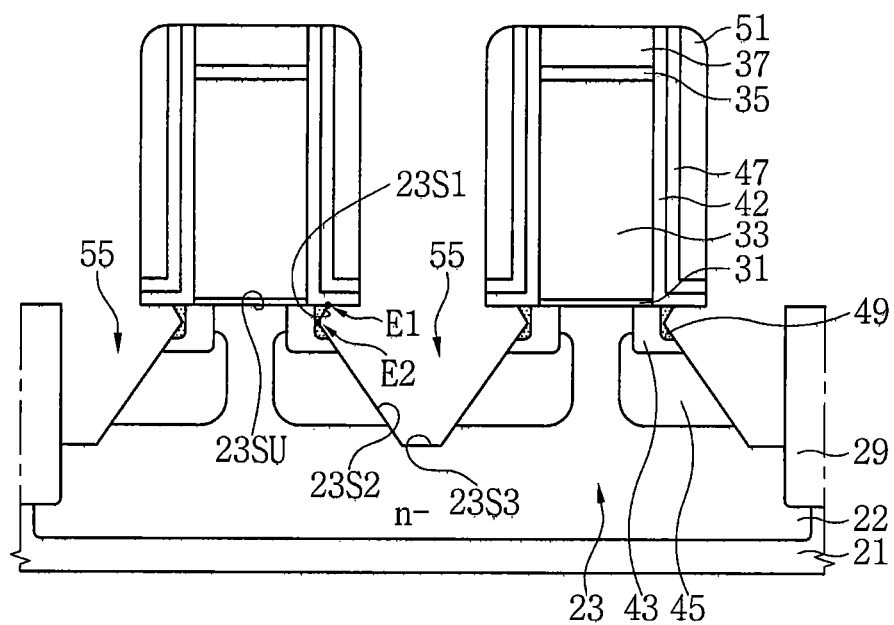

Referring to FIG. 7C, in some embodiments, the faster etch rate part 49 may be retained between the second trench 55 and the LDD 43.

Figure 8:
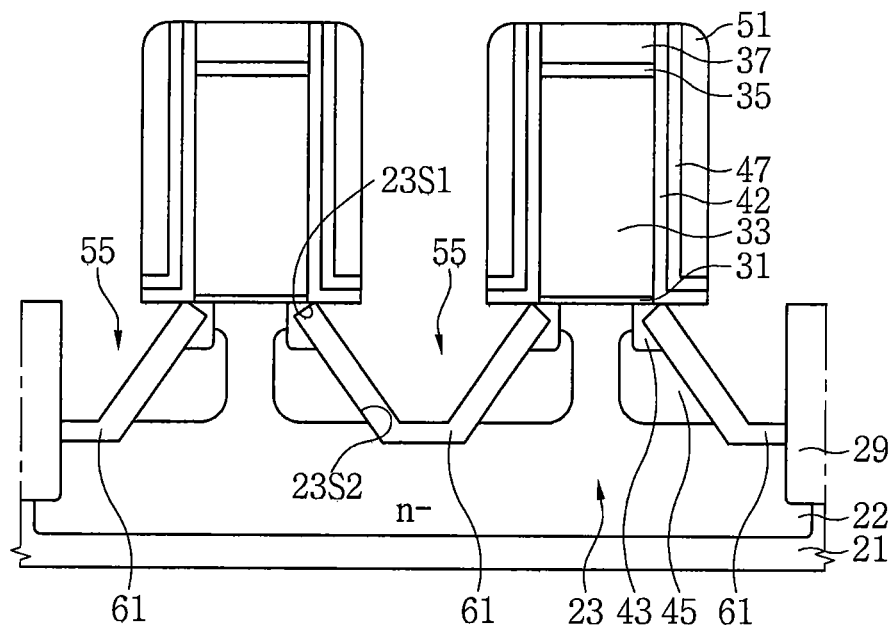

Referring to FIGS. 1 and 8, a first semiconductor layer 61 may be formed in the second trench 55 (Block 540). The first semiconductor layer 61 may include undoped single crystalline SiGe formed by a selective epitaxial growth (SEG) process. The Ge content in the first semiconductor layer 61 may be from 10% to 25%. The first semiconductor layer 61 may conformally cover an inner wall of the second trench 55. The first semiconductor layer 61 may cover the first side surface 23S1 and the second side surface 23S2.

Figure 9:
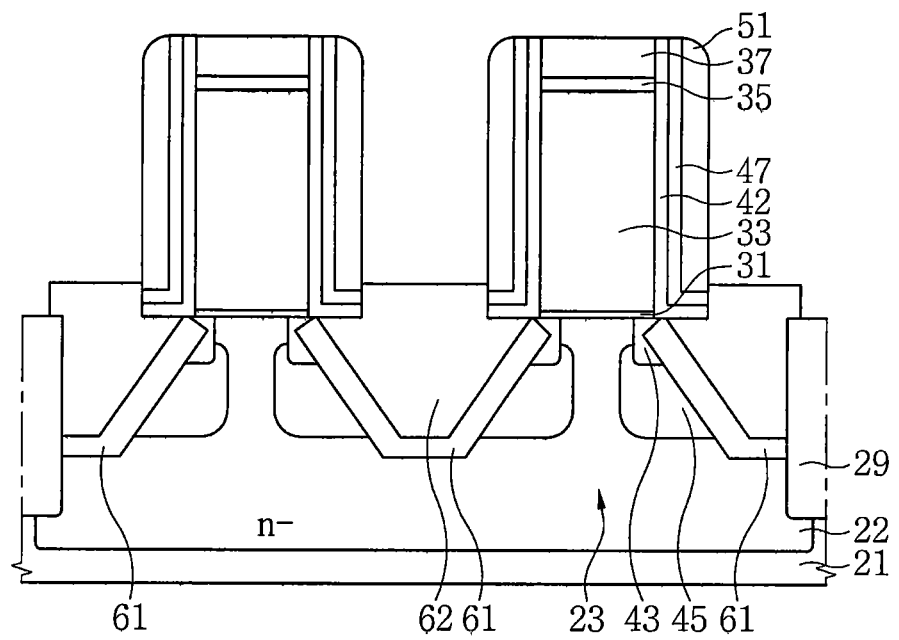

Referring to FIGS. 1 and 9, a second semiconductor layer 62 may be formed in the second trench 55 (Block 550). The second semiconductor layer 62 may include boron-doped single crystalline SiGe formed by an SEG process. The Ge content in the second semiconductor layer 62 may be higher than that in the first semiconductor layer 61. The Ge content in the second semiconductor layer 62 may range from 25% to 50%. The second semiconductor layer 62 may contain 1E20 to 3E20 atoms/cm$^3$ of boron. The second semiconductor layer 62 may fully fill the second trench 55. An upper end of the second semiconductor layer 62 may be at a higher level than the active region 23. The second semiconductor layer 62 may be in contact with a side surface of the third spacer 51.

Figure 10:
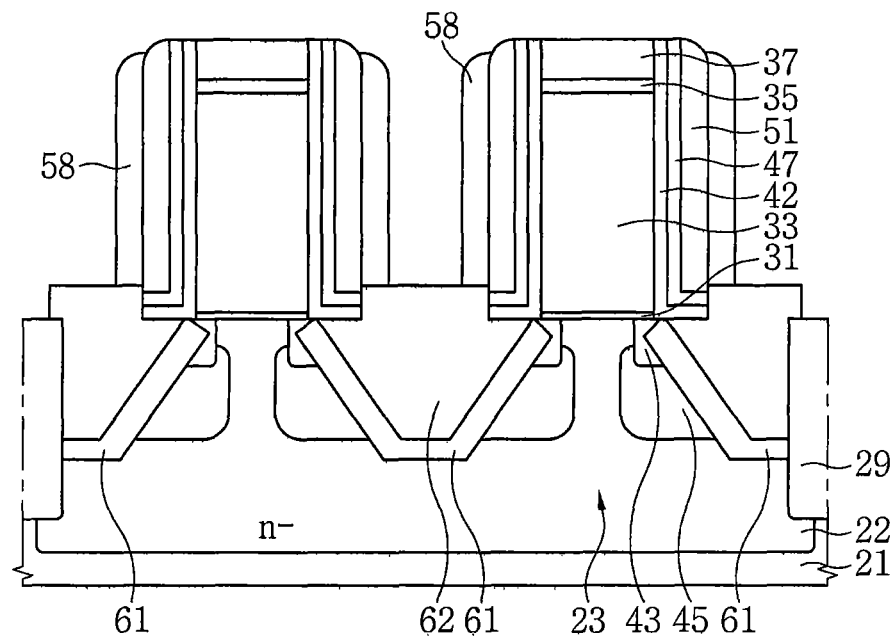

Referring to FIGS. 1 and 10, a fourth spacer 58 may be formed on the third spacer 51 (Block 553). The formation of the fourth spacer 58 may include a thin-film formation process and an anisotropic etching process. The fourth spacer 58 may cover a side surface of the third spacer 51, and partially cover an upper surface of the second semiconductor layer 62. A lower end of the fourth spacer 58 may be in contact with the upper surface of the second semiconductor layer 62. The fourth spacer 58 may include an insulating layer such as silicon oxide, silicon nitride, silicon oxy-nitride, or a combination thereof. The fourth spacer 58 may include a material having an etch selectivity with respect to the third spacer 51. For example, the fourth spacer 58 may include silicon oxide. In some embodiments, the fourth spacer 58 may be referred to as an additional spacer.

Figure 11A:
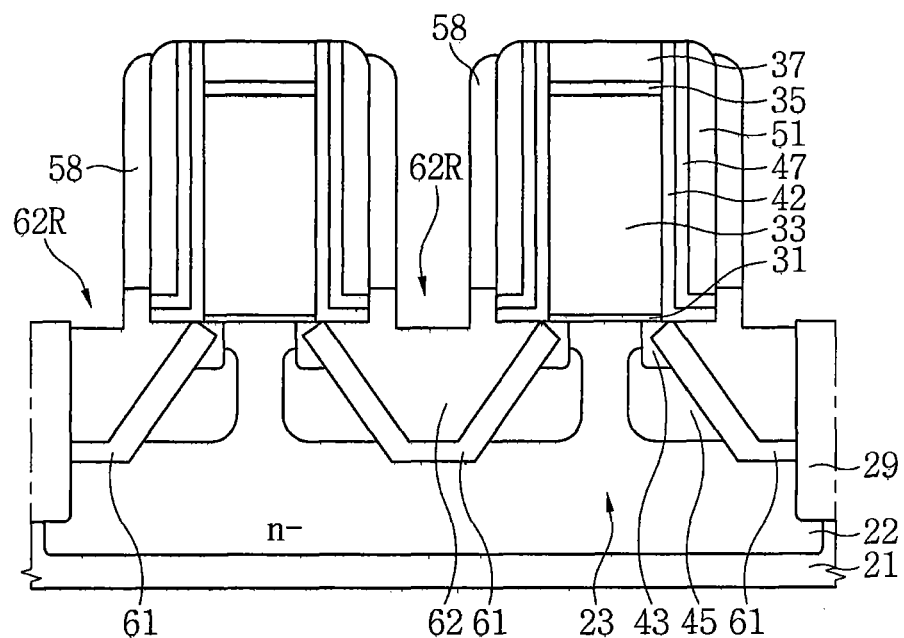

Referring to FIGS. 1 and 11A, the second semiconductor layer 62 may be partially removed to form a second recess area 62R (Block 556). The partial removal of the second semiconductor layer 62 may include an anisotropic etching process using the preliminary gate pattern 31, 33, 35, and 37, the first spacer 42, the second spacer 47, the third spacer 51, and the fourth spacer 58 as an etch mask. A side and a bottom of the second recess area 62R may expose the second semiconductor layer 62. A horizontal width of the bottom of the second recess area 62R may be substantially the same as that of a top of the second recess area 62R. The side surface of the second recess area 62R may be vertically aligned with a side surface of the fourth spacer 58. The bottom of the second recess area 62R may be formed at a lower level than an upper end of the active region 23.

Figure 11B:
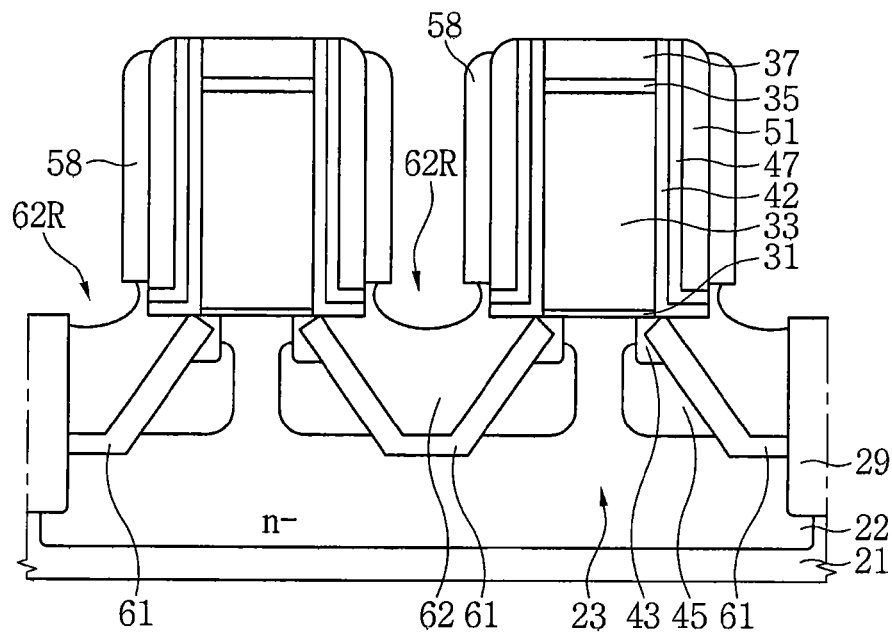

Referring to FIG. 11B, the partial removal of the second semiconductor layer 62 may include an isotropic etching process using the preliminary gate pattern 31, 33, 35, and 37, the first spacer 42, the second spacer 47, the third spacer 51, and the fourth spacer 58 as an etch mask. The bottom of the second recess area 62R may be formed to be round. The side surface of the second recess area 62R may extend under the fourth spacer 58. The recess area 62R may partially expose a lower surface of the fourth spacer 58. In some embodiments, the formation of the second recess area 62R may be omitted.

Figure 12A:
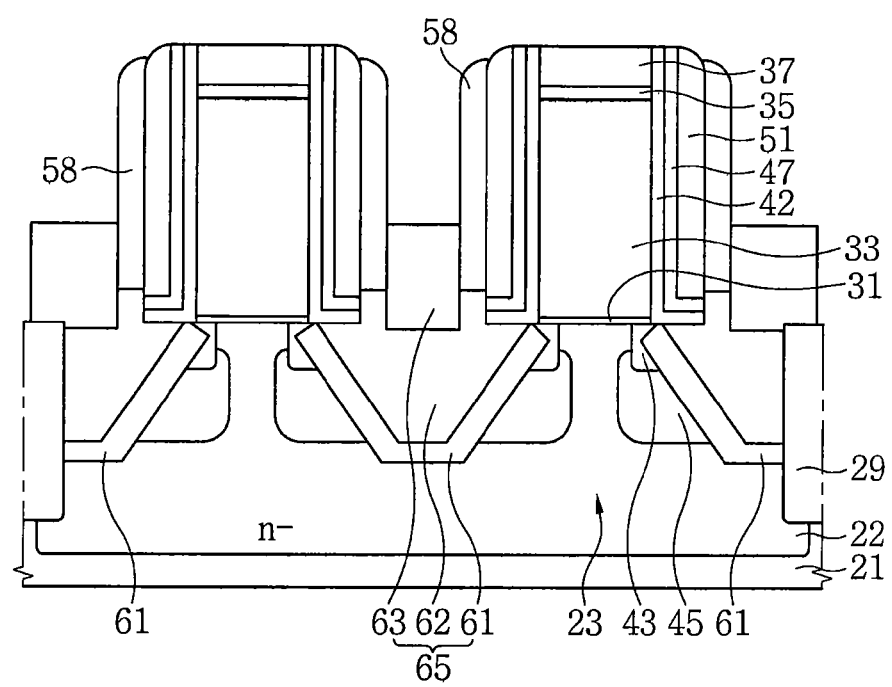

Referring to FIGS. 1 and 12A, a third semiconductor layer 63 may be formed on the second semiconductor layer 62 (Block 560). The third semiconductor layer 63 may include boron-doped single crystalline silicon or boron-doped single crystalline SiGe formed by an SEG process. The Ge content in the third semiconductor layer 63 may be lower than that in the second semiconductor layer 62. The Ge content in the third semiconductor layer 63 may be 10% or less. The third semiconductor layer 63 may contain 1E20 to 3E20 atoms/cm$^3$ of boron. The first semiconductor layer 61, the second semiconductor layer 62, and the third semiconductor layer 63 may form an embedded stressor 65. The embedded stressor 65 may be referred to as a strain-inducing pattern. The third semiconductor layer 63 may be referred to as a capping layer.

A lower end of the third semiconductor layer 63 may be formed at a lower level than the upper end of the second semiconductor layer 62. A side and a bottom of the third semiconductor layer 63 may be in contact with the second semiconductor layer 62. An upper end of the third semiconductor layer 63 may be formed at a higher level than the upper end of the second semiconductor layer 62. A lower end of the fourth spacer 58 may be in contact with the upper end of the second semiconductor layer 62, and a side surface of the fourth spacer 58 may be in contact with the third semiconductor layer 63. In some embodiments, the first semiconductor layer 61 may be omitted.

Figure 12B:
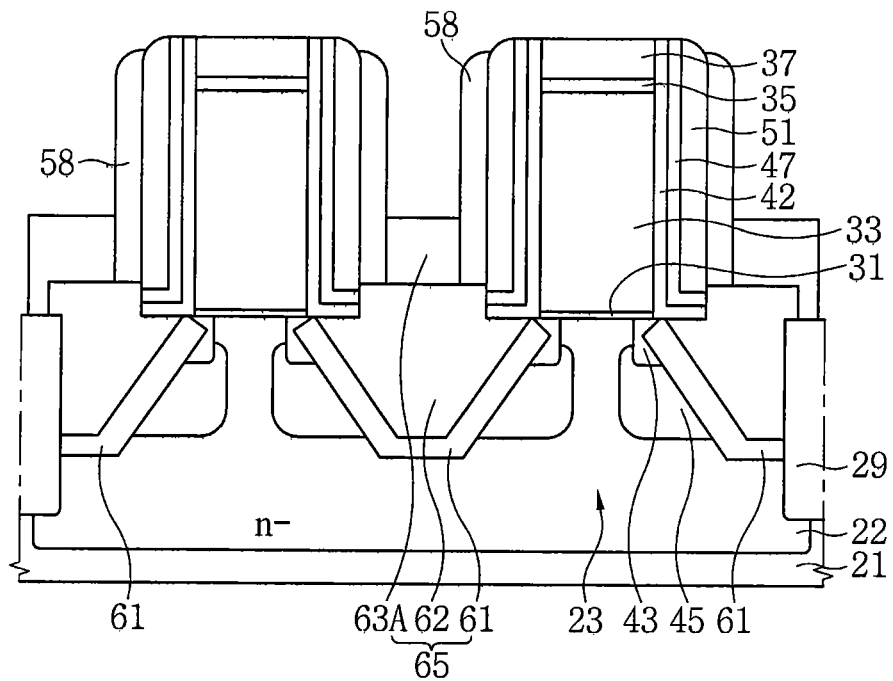

Referring to FIG. 12B, the upper surface of the second semiconductor layer 62 may be formed substantially at the same level as the lower surface of the fourth spacer 58. A third semiconductor layer 63A may be formed at a higher level than the upper end of the second semiconductor layer 62. A lower surface of the third semiconductor layer 63A may be in contact with the upper end of the second semiconductor layer 62, and a side surface of the third semiconductor layer 63A may be in contact with the fourth spacer 58.

Figure 13:
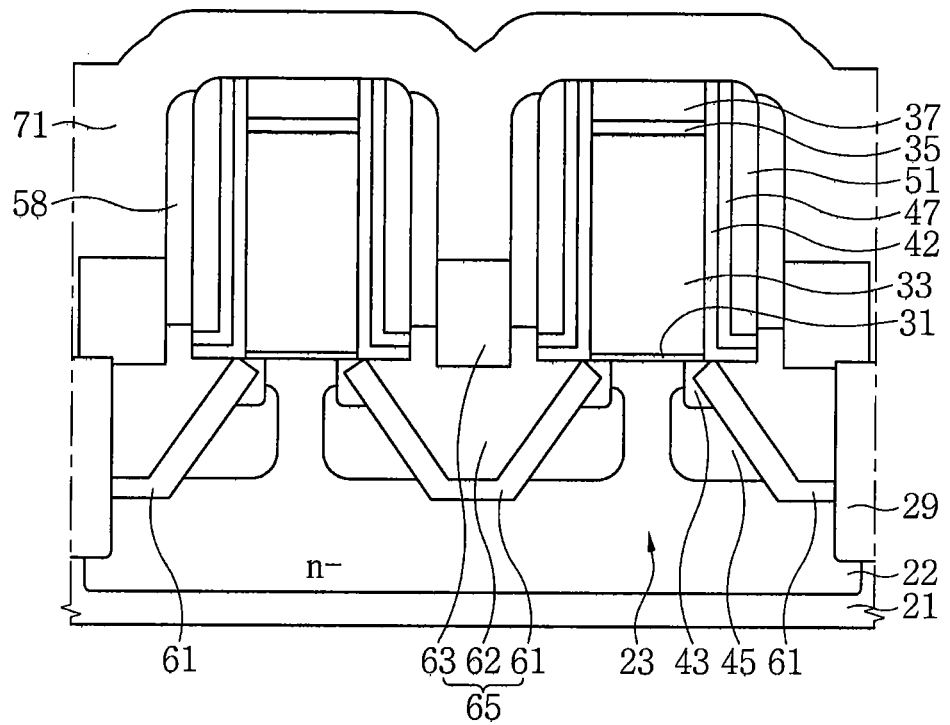

Referring to FIGS. 1 and 13, an interlayer insulating layer 71 may be formed on the substrate 21 (Block 570). The interlayer insulating layer 71 may include an insulating layer such as silicon oxide, silicon nitride, silicon oxy-nitride, or a combination thereof. In some embodiments, several additional processes, such as a metal silicide formation process and a heat treatment process, may be performed on the third semiconductor layer 63 before the formation of the interlayer insulating layer 71.

Figure 14:
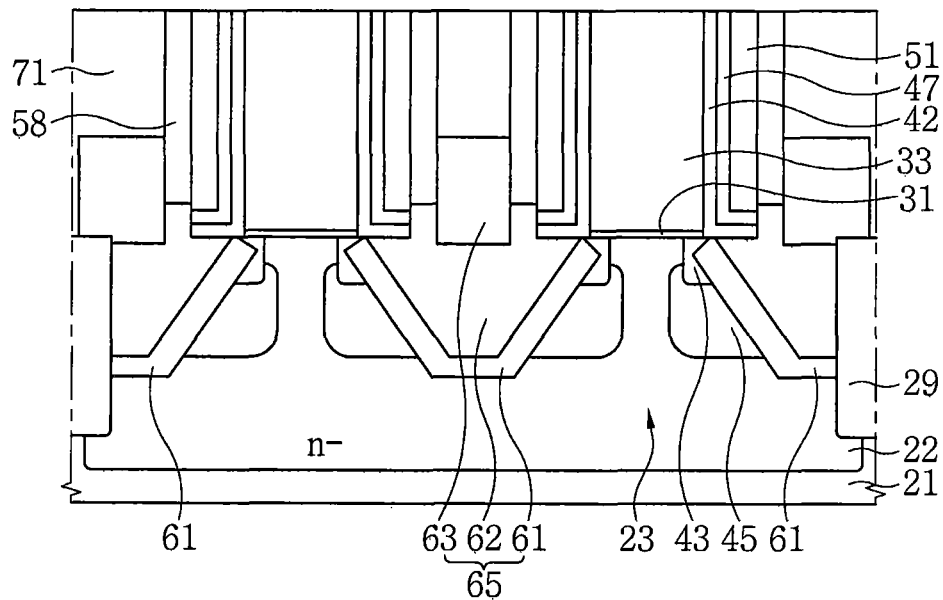

Referring to FIGS. 1 and 14, the preliminary gate electrode 33 may be exposed by partially removing the interlayer insulating layer 71, and removing the second mask pattern 37 and the first mask pattern 35. The removal of the interlayer insulating layer 71, the second mask pattern 37, and the first mask pattern 35 may be performed by a chemical mechanical polishing (CMP) process, an etch-back process, or a combination thereof. The interlayer insulating layer 71 may be retained on the third semiconductor layer 63.

Figure 15:
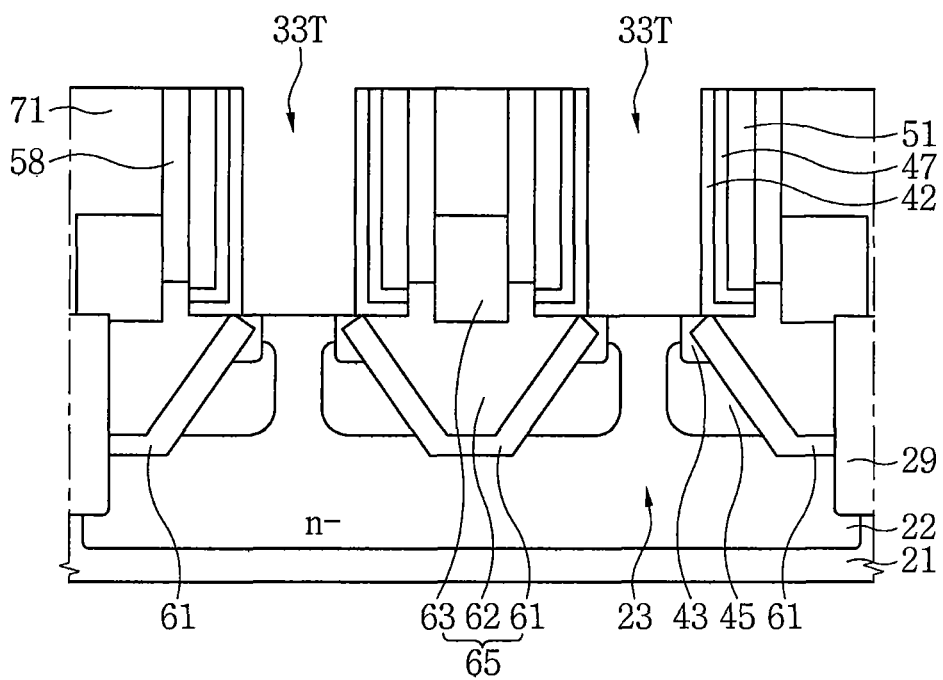

Referring to FIGS. 1 and 15, a gate trench 33T exposing the active region 23 may be formed by removing the preliminary gate electrode 33 and the buffer layer 31.

Figure 16A:
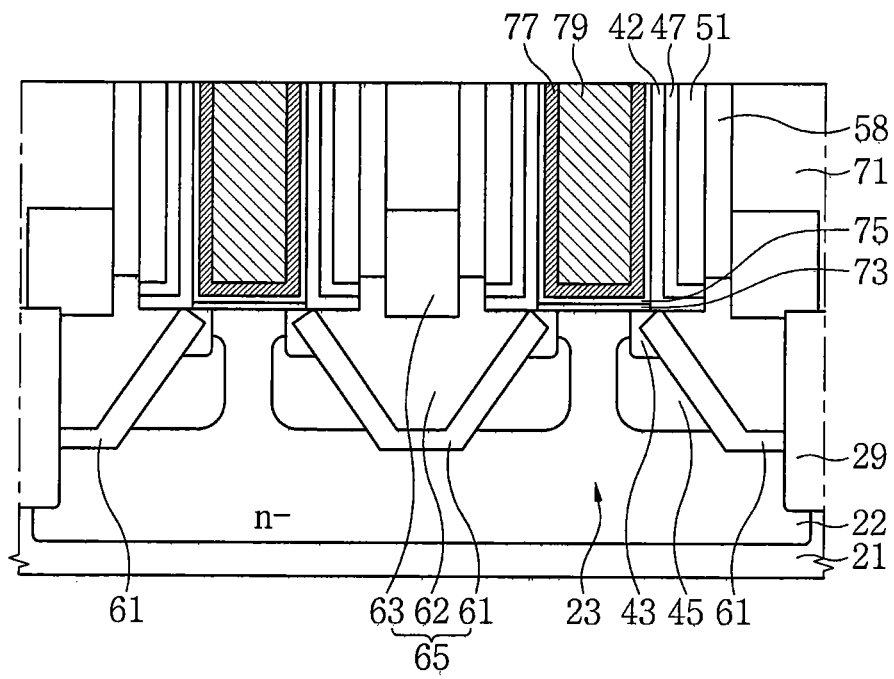

Referring to FIGS. 1 and 16A, a first gate dielectric layer 73, a second gate dielectric layer 75, a first gate electrode 77, and a second gate electrode 79 may be formed in the gate trench 33T.

The first gate dielectric layer 73 may be formed on the active region 23. The first gate dielectric layer 73 may be referred to as an interfacial oxide layer. The first gate dielectric layer 73 may be formed by a cleaning process. The first gate dielectric layer 73 may include silicon oxide. The second gate dielectric layer 75 may include silicon oxide, silicon nitride, silicon oxy-nitride, a high-K dielectric material, or a combination thereof. For example, the second gate dielectric layer 75 may include HfO or HfSiO. The second gate dielectric layer 75 may surround a side and a bottom of the first gate electrode 77. The first gate dielectric layer 73 may be interposed between the active region 23 and the second gate dielectric layer 75.

The first gate electrode 77 may surround a side and a bottom of the second gate electrode 79. The first gate electrode 77 may include a conductive material chosen by considering a work function. For example, the first gate electrode 77 may include TiN or TaN. The second gate electrode 79 may include a metal layer. In some embodiments, the first gate electrode 77 may include TiAl or TiAlC.

Figure 16B:
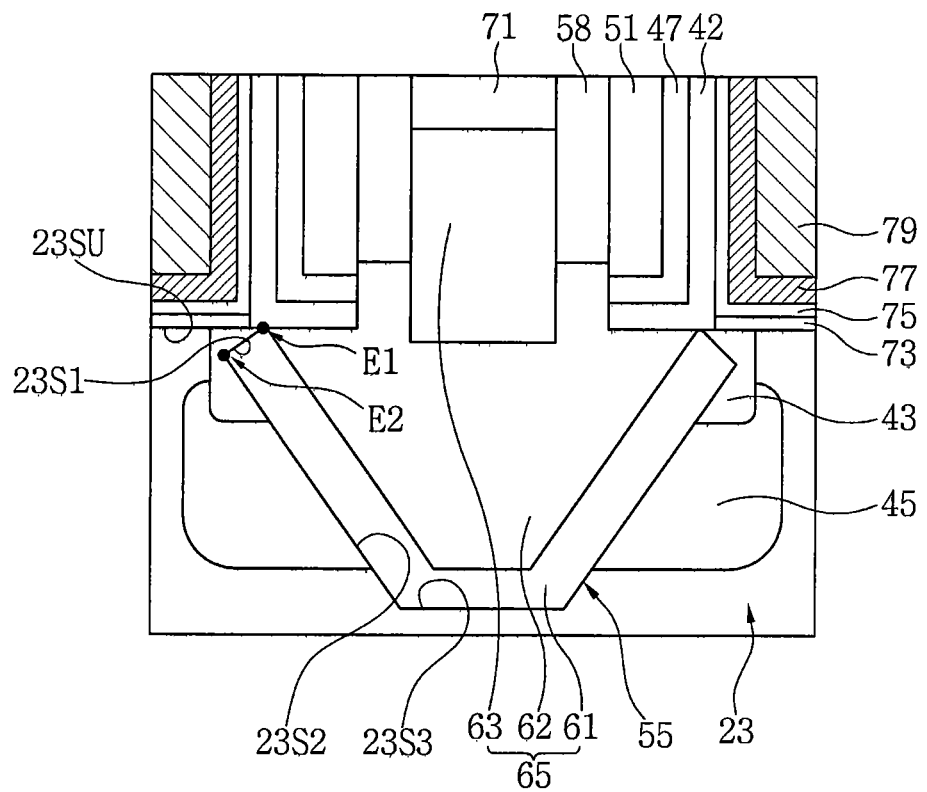

Referring to FIG. 16B, the embedded stressor 65 may pass through the LDD 43 and the halo 45 to be in contact with the active region 23. A bottom of the embedded stressor 65 may be formed at a lower level than the halo 45. The embedded stressor 65 may be in contact with the first side surface 23S1 and the second side surface 23S2. The first semiconductor layer 61 may be interposed between the LDD 43 and the second semiconductor layer 62. The upper end of the second semiconductor layer 62 may be formed at a higher level than a lower surface of the first gate electrode 77. An upper end of the third semiconductor layer 63 may be formed at a higher level than the upper end of the second semiconductor layer 62. The upper end of the third semiconductor layer 63 may be formed at a higher level than the lower surface of the first gate electrode 77.

The first spacer 42, the second spacer 47, and the third spacer 51 may be retained between the first gate electrode 77 and the second semiconductor layer 62. The first spacer 42, the second spacer 47, the third spacer 51, and the fourth spacer 58 may be retained between the first gate electrode 77 and the third semiconductor layer 63. The side surface of the third semiconductor layer 63 may be in contact with the second semiconductor layer 62 and the fourth spacer 58. The upper end of the second semiconductor layer 62 may contact a bottom of the fourth spacer 58, and the side surface of the third semiconductor layer 63 may contact the side surface of the fourth spacer 58. In some embodiments, an outer side surface of the second semiconductor layer 62 is not aligned with the side surface of the third semiconductor layer 63 due to the fourth spacer 58.

The concentration of the first conductivity-type impurities in the second semiconductor layer 62 may be higher than that in the LDD 43. For example, a boron concentration in the second semiconductor layer 62 may be higher than that in the LDD 43. The first conductivity-type impurities in the second semiconductor layer 62 may diffuse into the first semiconductor layer 61. In some embodiments, a boron concentration in the first semiconductor layer 61 may be lower than that in second semiconductor layer 62.

Phosphorous (P) implanted in the faster etch rate part 49 (e.g., as illustrated in FIG. 4) may diffuse into the LDD 43. The LDD 43 may contain phosphorous and boron. For example, the LDD 43 may contain 5E18 to 1E19 atoms/cm$^3$ of phosphorous. While implanting phosphorous to the faster etch rate part 49, the phosphorous may remain in the second spacer 47, the first spacer 42, and interfaces thereof. The phosphorous may remain in the third spacer 51 and an interface between the third spacer 51 and the second spacer 47. The phosphorous may remain in the embedded stressor 65 and interfaces between the embedded stressor 65 and the first, second and third spacers 42, 47, 51. In some embodiments, the phosphorous may also remain in the LDD 43 and between interfaces of the LDD 43 and the first, second and third spacers 42, 47, 51.

Figure 16C:
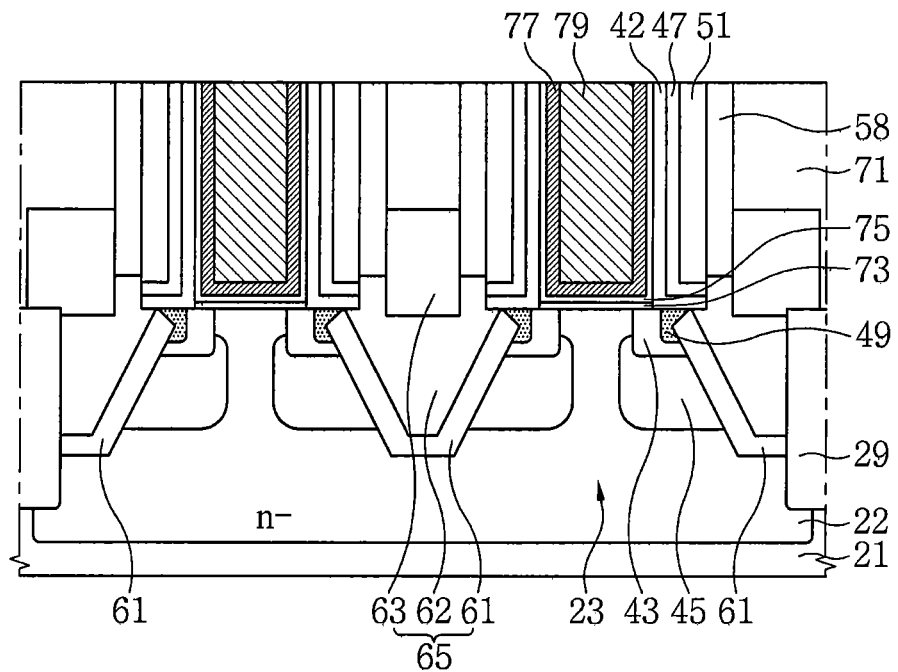

Referring to FIG. 16C, the faster etch rate part 49 may be partially retained between the embedded stressor 65 and the LDD 43.

Figure 16D:
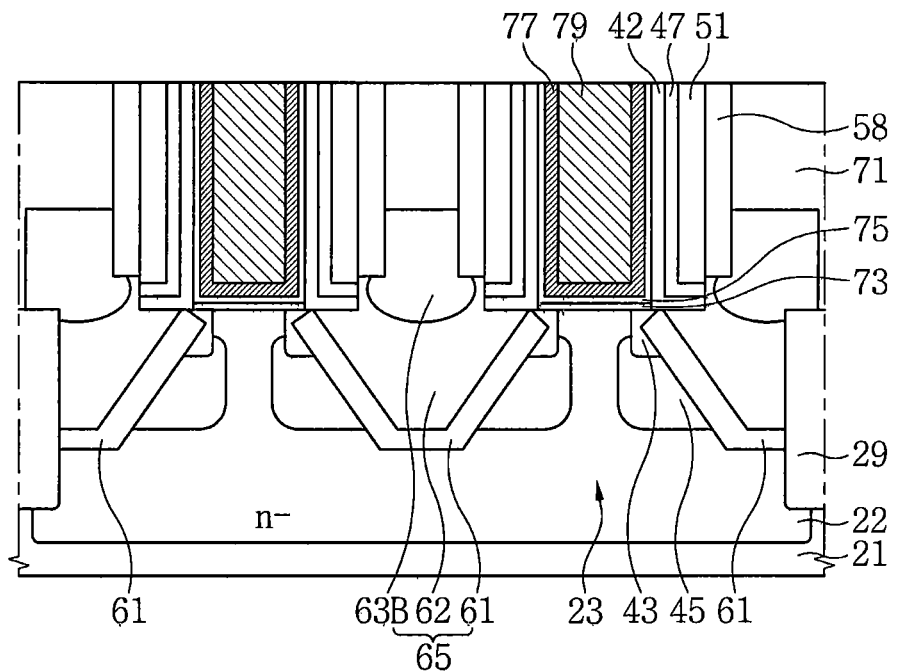

Referring to FIG. 16D, a lower end of a third semiconductor layer 63B may have a round shape. The lower end of a third semiconductor layer 63B may extend under the fourth spacer 58. The third semiconductor layer 63B may be in contact with a lower surface of the fourth spacer 58. The second semiconductor layer 62 may be retained between the third semiconductor layer 63B and the first spacer 42, the second spacer 47, and the third spacer 51.

Figure 16E:
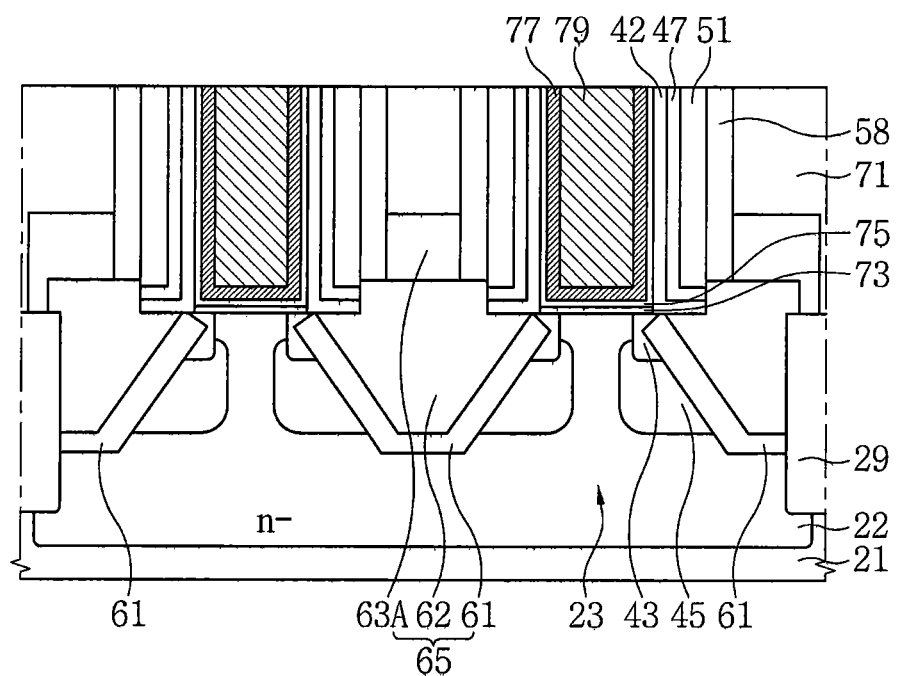

Referring to FIG. 16E, the third semiconductor layer 63A may be formed at a higher level than the upper end of the second semiconductor layer 62. A lower surface of the third semiconductor layer 63A may be in contact with the upper end of the second semiconductor layer 62, and a side surface of the third semiconductor layer 63A may be in contact with the fourth spacer 58.

FIGS. 17A-17E, 18-20, 21A-21E, 22A and 22B are cross-sectional views illustrating intermediate structures provided in operations of forming a semiconductor device according to some embodiments of the present inventive concepts.

Figure 17A:
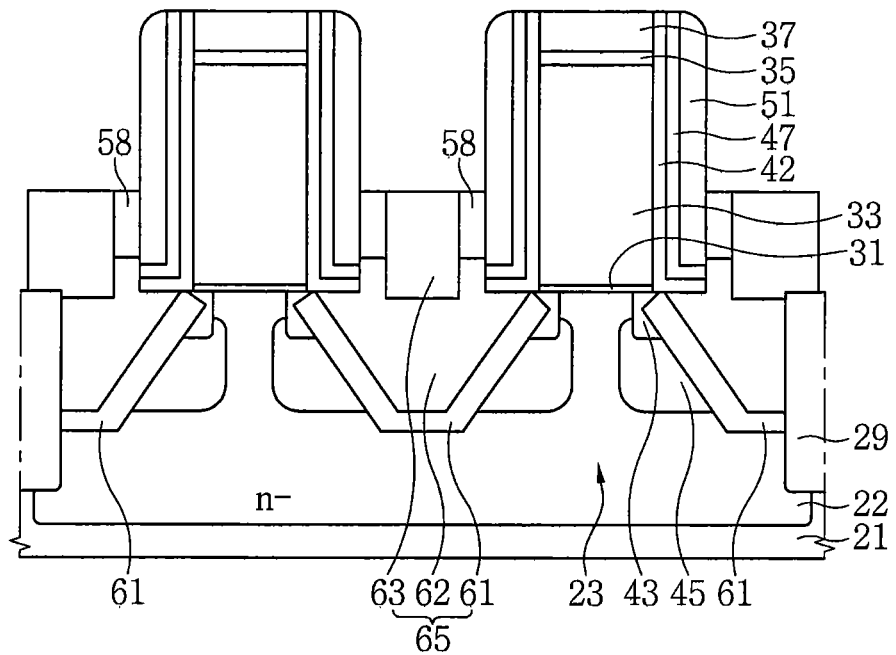
FIGS. 17A-17E, 18-20 and 21A-21E are cross-sectional views illustrating intermediate structures provided in operations of forming a semiconductor device according to some embodiments of the present inventive concepts.

Referring to FIG. 17A, the fourth spacer 58 may be partially removed using an isotropic etching process. The fourth spacer 58 may be retained between the third semiconductor layer 63 and the third spacer 51. The side surface of the third spacer 51 may be exposed. Upper surfaces of the fourth spacer 58 and third semiconductor layer 63 may be formed substantially at the same level.

Figure 17B:
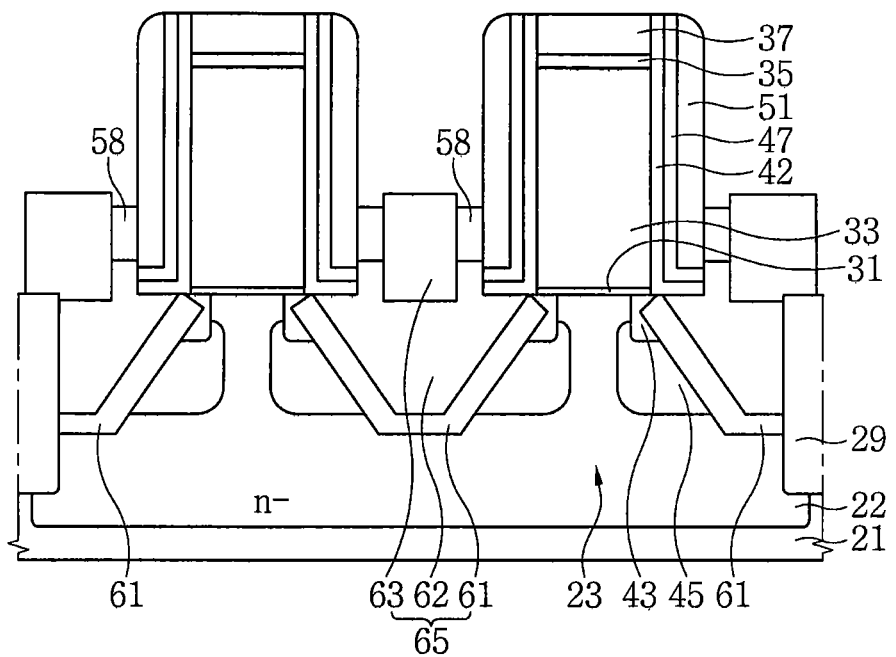

Referring to FIG. 17B, an upper surface of the fourth spacer 58 may be formed at a lower level than the upper end of the third semiconductor layer 63.

Figure 17C:
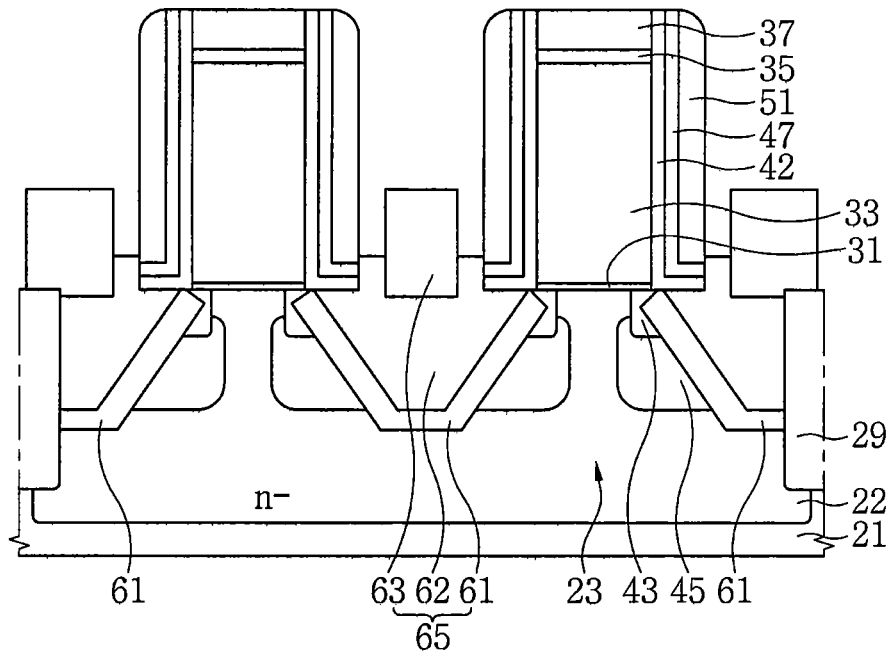

Referring to FIG. 17C, the fourth spacer 58 may be completely removed. The upper end of the second semiconductor layer 62 may be exposed between the third semiconductor layer 63 and the third spacer 51.

Figure 17D:
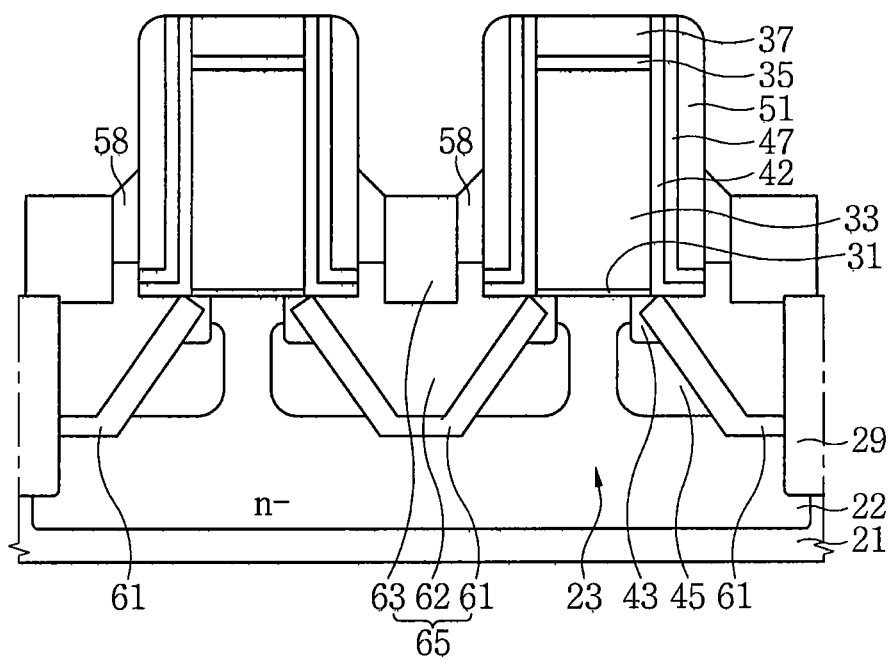

Referring to FIG. 17D, the upper surface of the fourth spacer 58 may be formed at a higher level than the upper end of the third semiconductor layer 63. The upper surface of the fourth spacer 58 may have a sloped side.

Figure 17E:
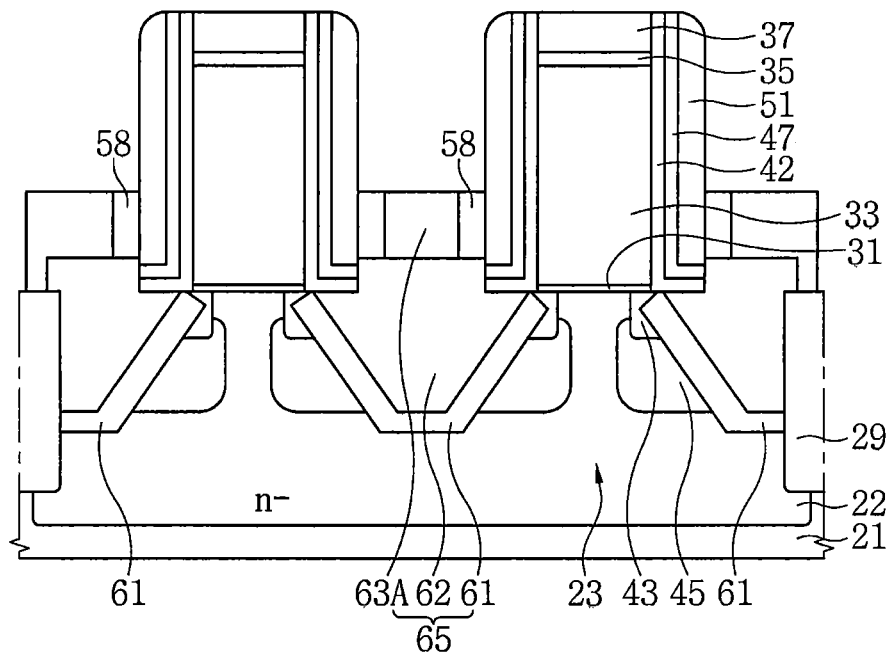

Referring to FIG. 17E, the third semiconductor layer 63A may be formed at a higher level than the upper end of the second semiconductor layer 62. The fourth spacer 58 may be retained between the third semiconductor layer 63A and the third spacer 51.

Figure 18:
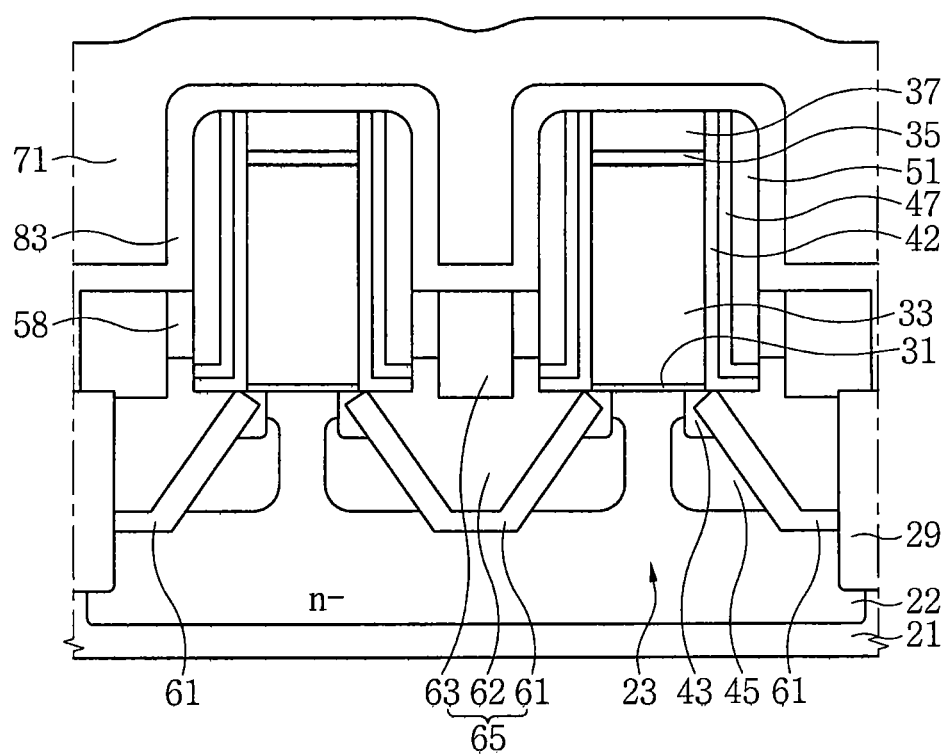

Referring to FIG. 18, an etch-stopping layer 83 and an interlayer insulating layer 71 may be sequentially formed on the substrate 21. The etch-stopping layer 83 may cover the third semiconductor layer 63 and the fourth spacer 58. The etch-stopping layer 83 may include a material having an etch selectivity with respect to the interlayer insulating layer 71. For example, the interlayer insulating layer 71 may include silicon oxide and the etch-stopping layer 83 may include silicon nitride.

Figure 19:
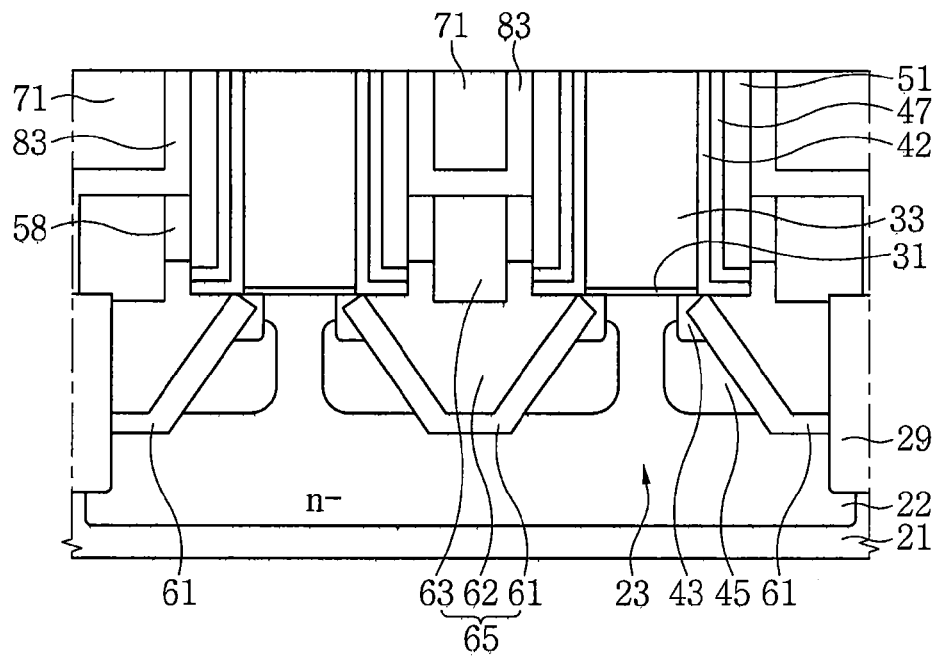

Referring to FIG. 19, the preliminary gate electrode 33 may be exposed by partially etching the interlayer insulating layer 71 and the etch-stopping layer 83, and etching the second mask pattern 37 and the first mask pattern 35. The etch-stopping layer 83 and the interlayer insulating layer 71 may be retained on the third semiconductor layer 63.

Figure 20:
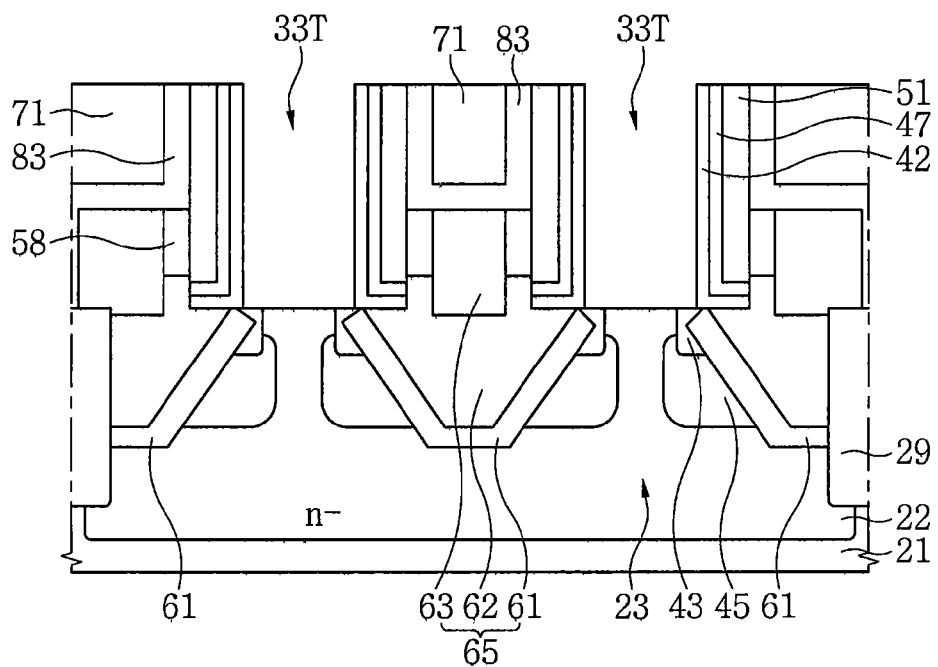

Referring to FIG. 20, a gate trench 33T exposing the active region 23 may be formed by removing the preliminary gate electrode 33 and the buffer layer 31.

Figure 21A:
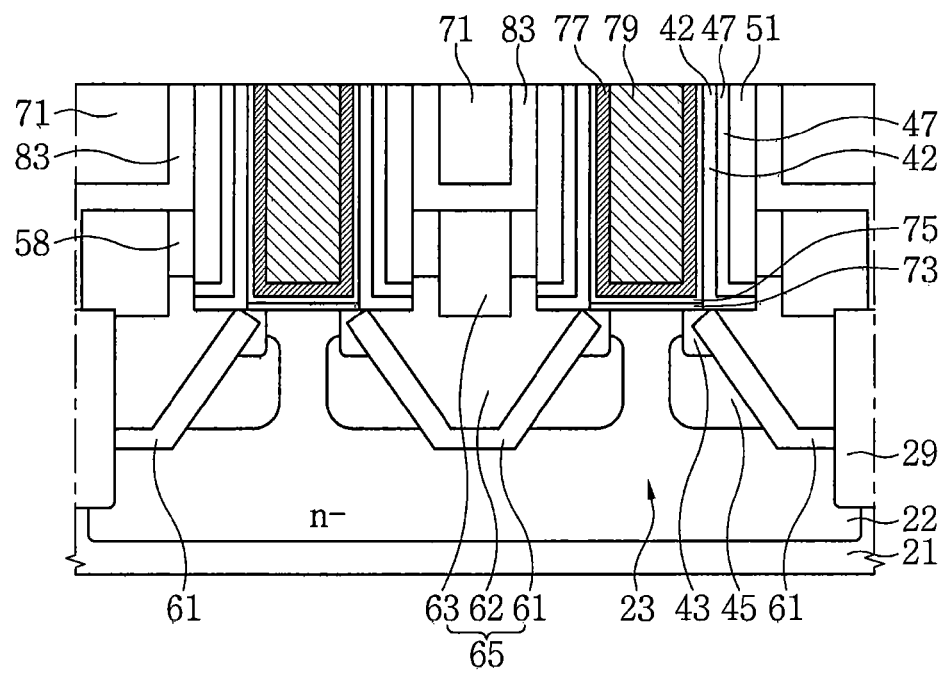

Referring to FIG. 21A, a first gate dielectric layer 73, a second gate dielectric layer 75, a first gate electrode 77, and a second gate electrode 79 may be formed in the gate trench 33T. The etch-stopping layer 83 may cover the third semiconductor layer 63 and the fourth spacer 58. The etch-stopping layer 83 may be formed at a higher level than upper ends of the third semiconductor layer 63 and the fourth spacer 58.

Figure 21B:
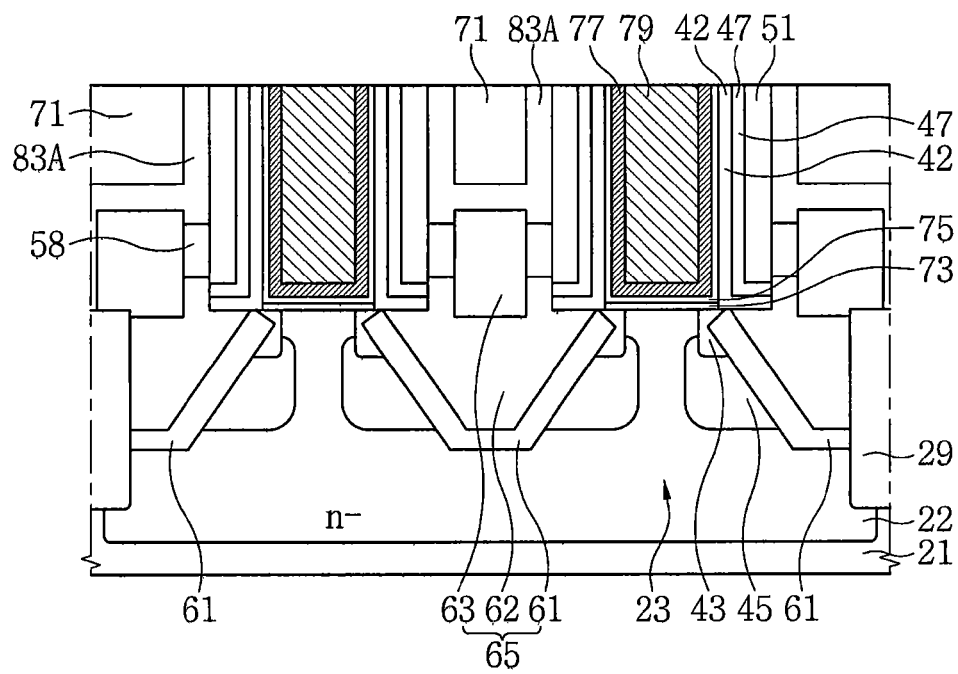

Referring to FIG. 21B, an etch-stopping layer 83A may cover the upper surface of the third semiconductor layer 63 and may partially cover the side surface of the third semiconductor layer 63. A lower end of the etch-stopping layer 83A may be formed at a lower level than the upper end of the third semiconductor layer 63. The upper surface of the fourth spacer 58 may be formed at a lower level than the upper end of the third semiconductor layer 63.

Figure 21C:
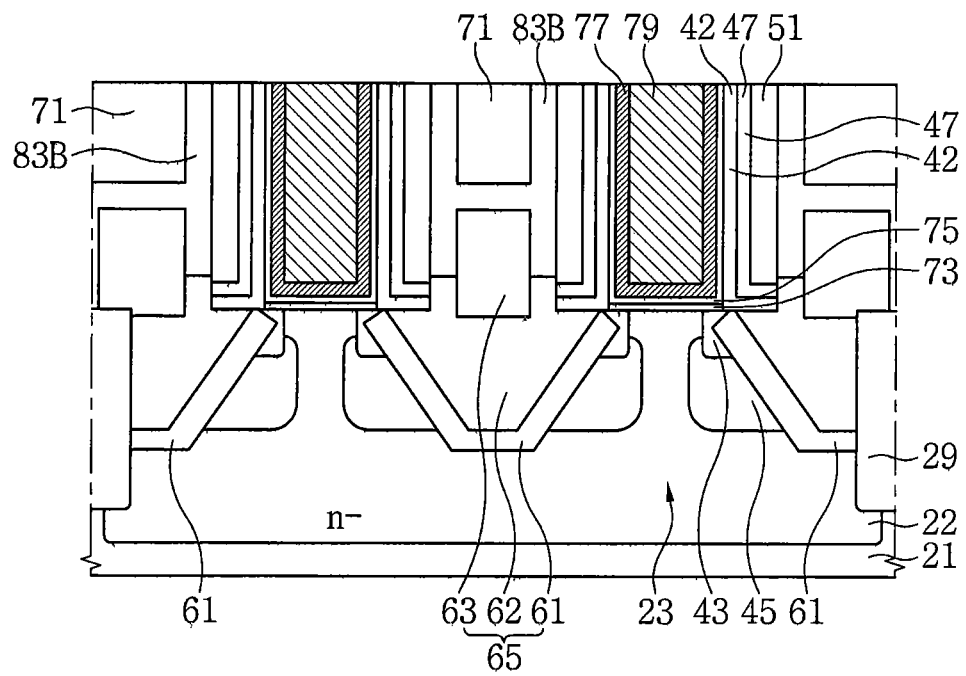

Referring to FIG. 21C, when the fourth spacer 58 is fully removed, an etch-stopping layer 83B may fill a space between the third semiconductor layer 63 and the third spacer 51, and be in contact with the upper end of the second semiconductor layer 62.

Figure 21D:
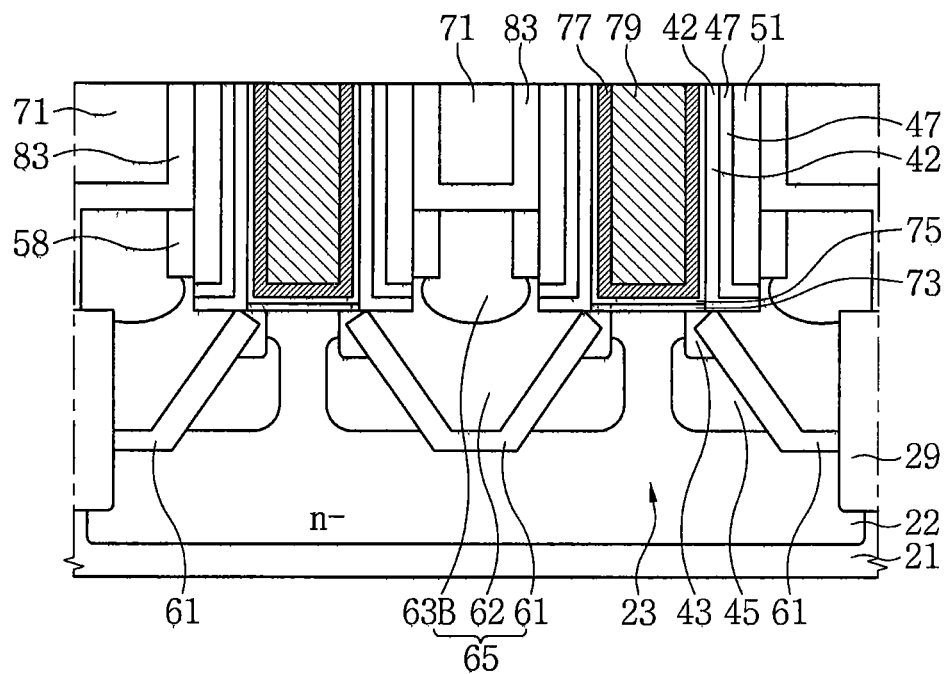

Referring to FIG. 21D, a lower end of the third semiconductor layer 63B may have a rounded shape.

Figure 21E:
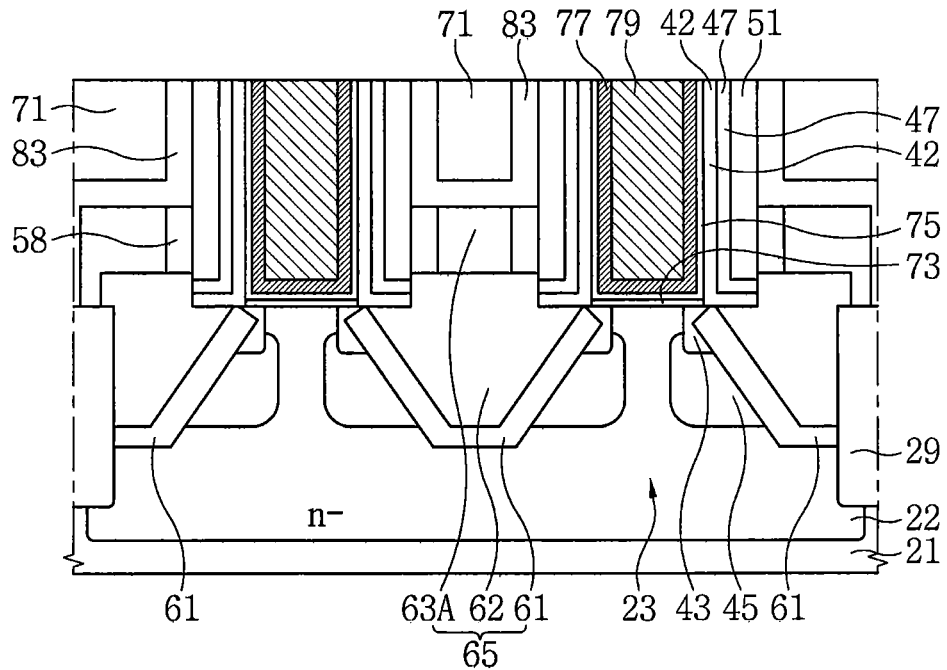

Referring to FIG. 21E, a third semiconductor layer 63A may be formed at a higher level than the upper end of the second semiconductor layer 62.

Figure 22A:
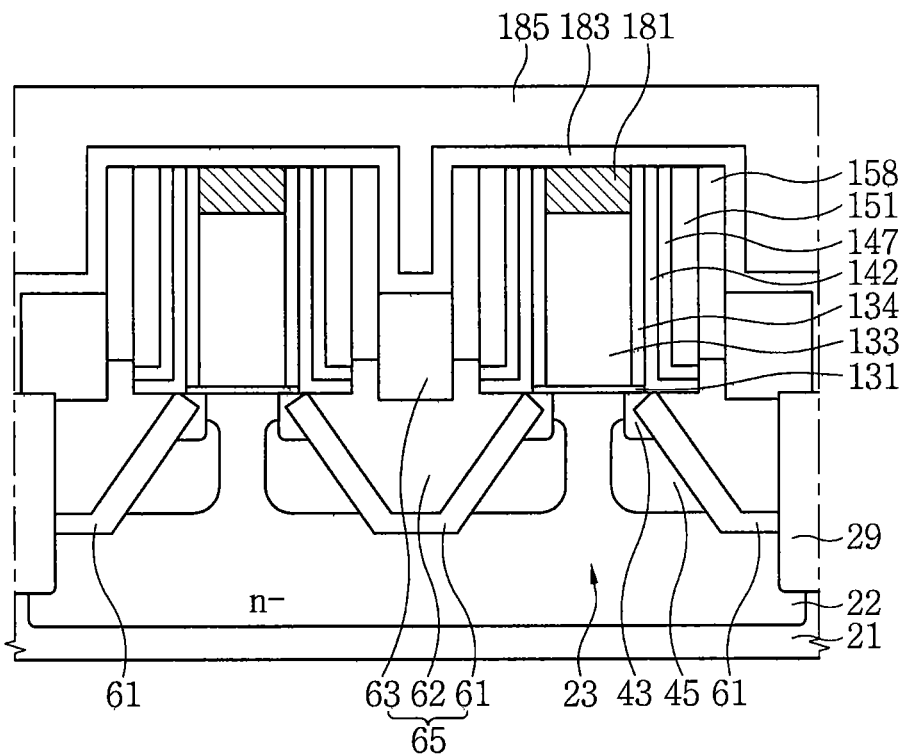
FIGS. 22A and 22B are cross-sectional views illustrating intermediate structures provided in operations of forming a semiconductor device according to some embodiments of the present inventive concepts.
Figure 22B:
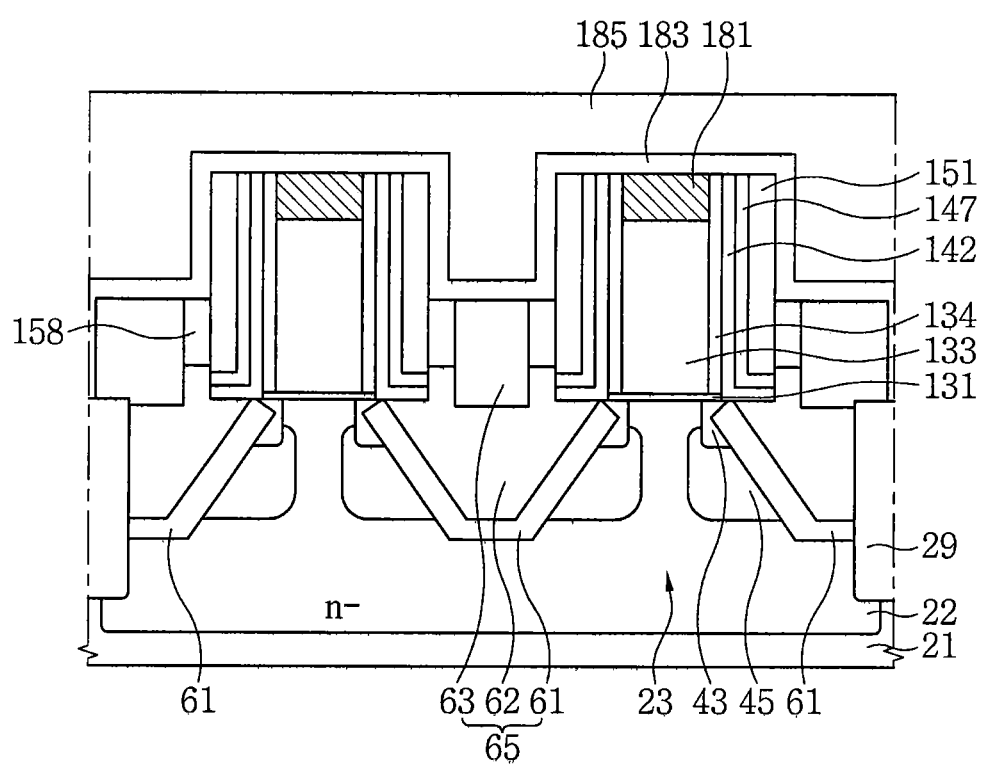

FIGS. 22A and 22B are cross-sectional views illustrating intermediate structures provided in operations of forming a semiconductor device according to some embodiments of the present inventive concepts. Referring to FIG. 22A, a well 22, an active region 23, a device isolation layer 29, a gate dielectric layer 131, a first gate electrode 133, a second gate electrode 181, an inner spacer 134, a first spacer 142, a lightly doped drain (LDD) 43, a halo 45, a second spacer 147, a third spacer 151, a fourth spacer 158, an embedded stressor 65, an etch-stopping layer 183, and an interlayer insulating layer 185 may be formed in the substrate 21. The gate dielectric layer 131 and the first gate electrode 133 may be formed before the embedded stressor 65 is formed. The etch-stopping layer 183 may cover the upper surface of the third semiconductor layer 63 and a side surface of the fourth spacer 158.

The gate dielectric layer 131 may include silicon oxide, silicon nitride, silicon oxy-nitride, a high-K dielectric layer, or a combination thereof. The first gate electrode 133 may include polysilicon, a metal silicide, a metal, or a combination thereof. The second gate electrode 181 may include a conductive layer such as a metal silicide, a metal, or a combination thereof. The inner spacer 134 may include silicon oxide, silicon nitride, silicon oxy-nitride, or a combination thereof.

Referring to FIG. 22B, the fourth spacer 158 may be retained between the third semiconductor layer 63 and the third spacer 151. The etch-stopping layer 183 may cover the upper surfaces of the third semiconductor layer 63 and fourth spacer 158, and the side surface of the third spacer 168.

FIGS. 23-28, 29A and 29B are cross-sectional views illustrating intermediate structures provided in operations of forming a semiconductor device according to some embodiments of the present inventive concepts.

Figure 23:
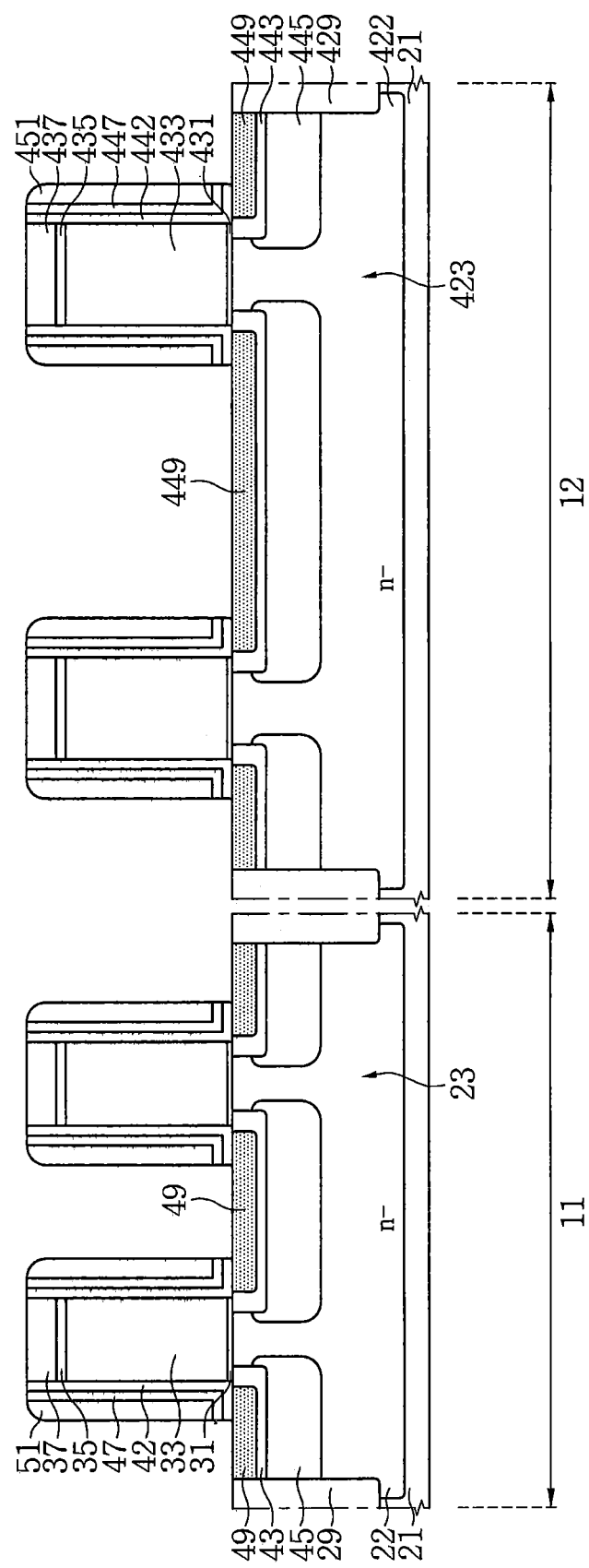
FIGS. 23-28, 29A and 29B are cross-sectional views illustrating intermediate structures provided in operations of forming a semiconductor device according to some embodiments of the present inventive concepts.

Referring to FIG. 23, a first well 22, a first active region 23, a first device isolation layer 29, a first buffer layer 31, a first preliminary gate electrode 33, a first lower mask pattern 35, and a first upper mask pattern 37 may be formed in the first region 11 of a substrate 21. The substrate 21 may include first conductivity-type impurities. The first well 22 may include second conductivity-type impurities different from the first conductivity-type impurities. Hereinafter, the description will be made under the assumption that the first conductivity is p-type, and the second conductivity is n-type.

The first active region 23 may be confined to the first well 22 by the first device isolation layer 29. The first preliminary gate electrode 33 may be formed to cross the first active region 23. The first upper mask pattern 37, the first lower mask pattern 35, the first preliminary gate electrode 33, and the first buffer layer 31 may be referred to as a first preliminary gate pattern 31, 33, 35, and 37. The first preliminary gate pattern 31, 33, 35, and 37 may cross the first active region 23. A plurality of the first preliminary gate patterns 31, 33, 35, and 37 may be formed in parallel on the first active region 23.

A first inner spacer 42 may be formed on a sidewall of the first preliminary gate electrode 33. A first LDD 43 may be formed by implanting the first conductivity-type impurities in the first active region 23 using the first inner spacer 42, the first upper mask pattern 37, the first lower mask pattern 35, and the first preliminary gate electrode 33 as an ion-implantation mask. A first halo 45 may be formed by implanting the second conductivity-type impurities in the first active region 23. The first halo 45 may cover a side and a bottom of the first LDD 43. The formation of the first LDD 43 and the first halo 45 may include an ion-implantation process and a heat treatment process.

A first intermediate spacer 47 may be formed on the first inner spacer 42. A first faster etch rate part 49 may be formed in the first active region 23 using the first intermediate spacer 47 as an ion-implantation mask. A first outer spacer 51 may be formed on the first intermediate spacer 47. The formation of the first outer spacer 51 may include a thin-film formation process and an anisotropic etching process. An upper surface of the first faster etch rate part 49 may be exposed.

A second well 422, a second active region 423, a second device isolation layer 429, a second buffer layer 431, a second preliminary gate electrode 433, a second lower mask pattern 435, and a second upper mask pattern 437 may be formed in the second region 12 of the substrate 21. The second well 422 may include second conductivity-type impurities. The second region 12 may have a pattern density lower than that of the first region 11. The second region 12 may have an open ratio higher than that of the first region 11.

The second active region 423 may be confined to the second well 422 by the second device isolation layer 429. The second preliminary gate electrode 433 may be formed to cross the second active region 423. The second upper mask pattern 437, the second lower mask pattern 435, the second preliminary gate electrode 433, and the second buffer layer 431 may be referred to as a second preliminary gate pattern 431, 433, 435, and 437. The second preliminary gate pattern 431, 433, 435, and 437 may cross the second active region 423. A plurality of the second preliminary gate patterns 431, 433, 435, and 437 may be formed in parallel on the second active region 423.

A second inner spacer 442 may be formed on a sidewall of the second preliminary gate electrode 433. A second LDD 443 may be formed by implanting the first conductivity-type impurities in the second active region 423 using the second inner spacer 442, the second upper mask pattern 437, the second lower mask pattern 435, and the second preliminary gate electrode 433 as an ion-implantation mask. A second halo 445 may be formed by implanting the second conductivity-type impurities in the second active region 423. The second halo 445 may cover a side and a bottom of the second LDD 443. The formation of the second LDD 443 and the second halo 445 may include an ion-implantation process and a heat treatment process.

A second intermediate spacer 447 may be formed on the second inner spacer 442. A second faster etch rate part 449 may be formed in the second active region 423 using the second intermediate spacer 447 as an ion-implantation mask. A second outer spacer 451 may be formed on the second intermediate spacer 447. The formation of the second outer spacer 451 may include a thin-film formation process and an anisotropic etching process. An upper surface of the second faster etch rate part 449 may be exposed.

The first LDD 43 and the second LDD 443 may contain boron. Although the second LDD 443 may have a boron concentration different from a boron concentration of the first LDD 43, hereinafter the description will be made under the assumption that the second LDD 443 may have a boron concentration similar to that of the first LDD 43. The first faster etch rate part 49 and the second faster etch rate part 449 may contain phosphorous. Although the second faster etch rate part 449 may have a phosphorous concentration different from a phosphorous concentration of the first faster etch rate part 49, hereinafter the description will be made under the assumption that the second faster etch rate part 449 may have a phosphorous concentration similar to a phosphorous concentration of the first faster etch rate part 49.

Figure 24:
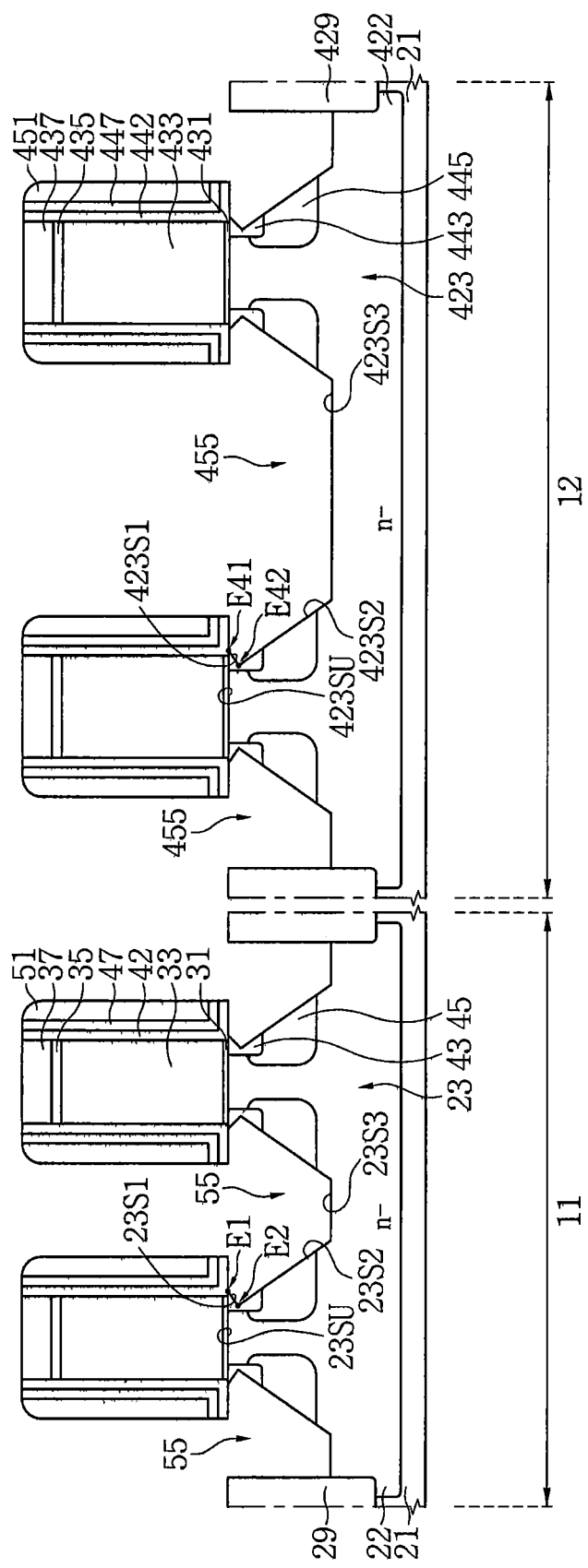

Referring to FIG. 24, a first trench 55 in the first active region 23 and a second trench 455 in the second active region 423 may be formed by a combination of an isotropic etch process, anisotropic etch process, and directional etch process. For example, the formation of the first trench 55 and the second trench 455 may include a wet-etch process using $NH_4OH$, $NH_3OH$, TMAH (Tetra Methyl Ammonium Hydroxide), KOH, NaOH, BTMH (benzyltrimethylammonium hydroxide), or a combination thereof.

The first active region 23 may have a first sigma-shape (Σ-shape) due to the first trench 55. The first LDD 43 may be retained under the first preliminary gate pattern 31, 33, 35, and 37. The first active region 23 may include a first surface 23SU, a first side surface 23S1, a second side surface 23S2, and a second surface 23S3. A first edge E1 may be defined between the first side surface 23S1 and the first surface 23SU. A second edge E2 may be defined between the first side surface 23S1 and the second side surface 23S2.

The second active region 423 may have a second sigma-shape (Σ-shape) due to the second trench 455. The second LDD 443 may be retained under the second preliminary gate pattern 431, 433, 435, and 437. The second active region 423 may include a third surface 423SU, a third side surface 423S1, a fourth side surface 423S2, and a fourth surface 423S3. A third edge E41 may be defined between the third side surface 423S1 and the third surface 423SU. A fourth edge E42 may be defined between the third side surface 423S1 and the fourth side surface 423S2.

Using the configuration of the first LDD 43 and the first faster etch rate part 49, the first edge E1 and the second edge E2 may be formed at a desired position. The first edge E1 and the second edge E2 may be formed on a surface of the first LDD 43. Using the configuration of the second LDD 443 and the second faster etch rate part 449, the third edge E41 and the fourth edge E42 may be formed at a desired position. The third edge E41 and the fourth edge E42 may be located on a surface of the second LDD 443.

The first trench 55 may be formed adjacent a side of the first preliminary gate pattern 31, 33, 35, and 37, and the second trench 455 may be formed adjacent a side of the second preliminary gate pattern 431, 433, 435, and 437. A horizontal width of the second trench 455 may be 2 to 100 times greater than a horizontal width of the first trench 55.

Figure 25:
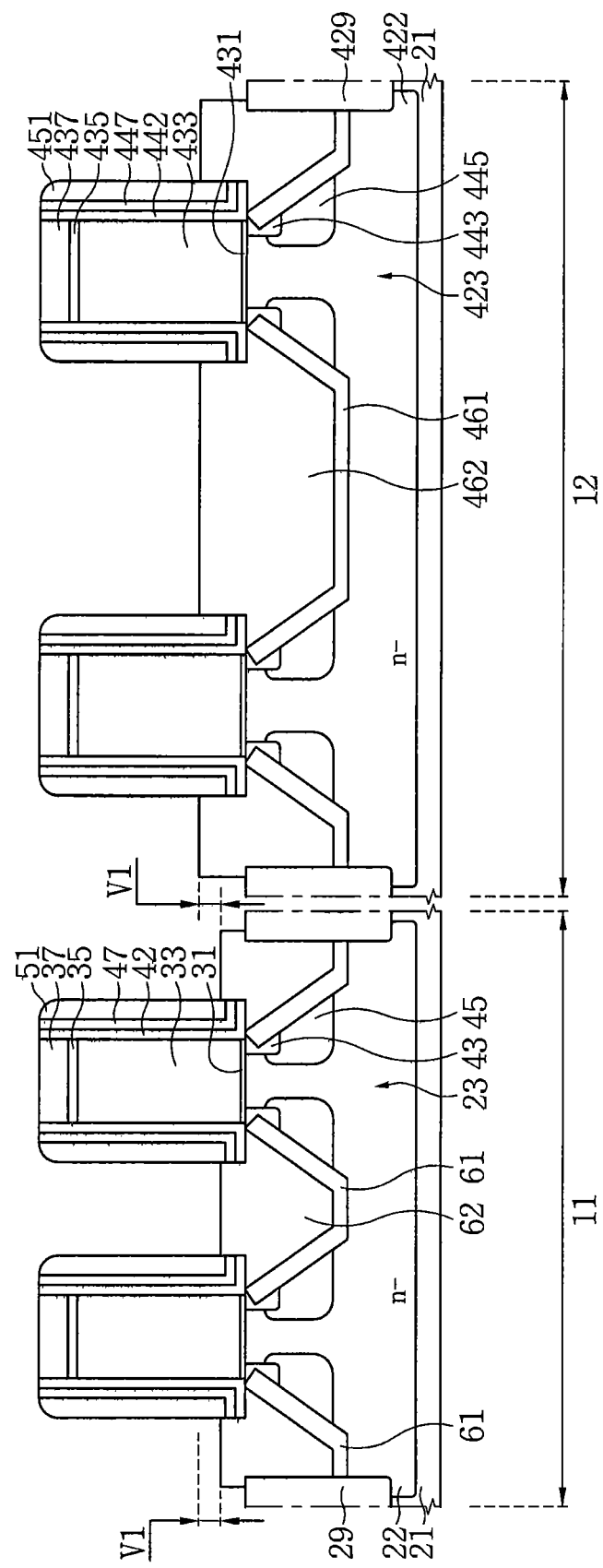

Referring to FIG. 25, a first lower semiconductor layer 61 may be formed in the first trench 55, and a second lower semiconductor layer 461 may be formed in the second trench 455. A first intermediate semiconductor layer 62 may be formed on the first lower semiconductor layer 61, and a second intermediate semiconductor layer 462 may be formed on the second lower semiconductor layer 461. An upper end of the second intermediate semiconductor layer 462 may be formed at a higher level than an upper end of the first intermediate semiconductor layer 62. A distance between the upper end of the first intermediate semiconductor layer 62 and the upper end of the second intermediate semiconductor layer 462 may be defined as a first vertical distance V1.

The second lower semiconductor layer 461 may include the same material layer formed concurrently with the first lower semiconductor layer 61, and the second intermediate semiconductor layer 462 may include the same material layer formed concurrently with the first intermediate semiconductor layer 62. For example, the first lower semiconductor layer 61 and the second lower semiconductor layer 461 may include boron-doped single crystalline SiGe formed by an SEG process. The Ge content in the first intermediate semiconductor layer 62 and the second intermediate semiconductor layer 462 may be 25 to 50%.

Figure 26:
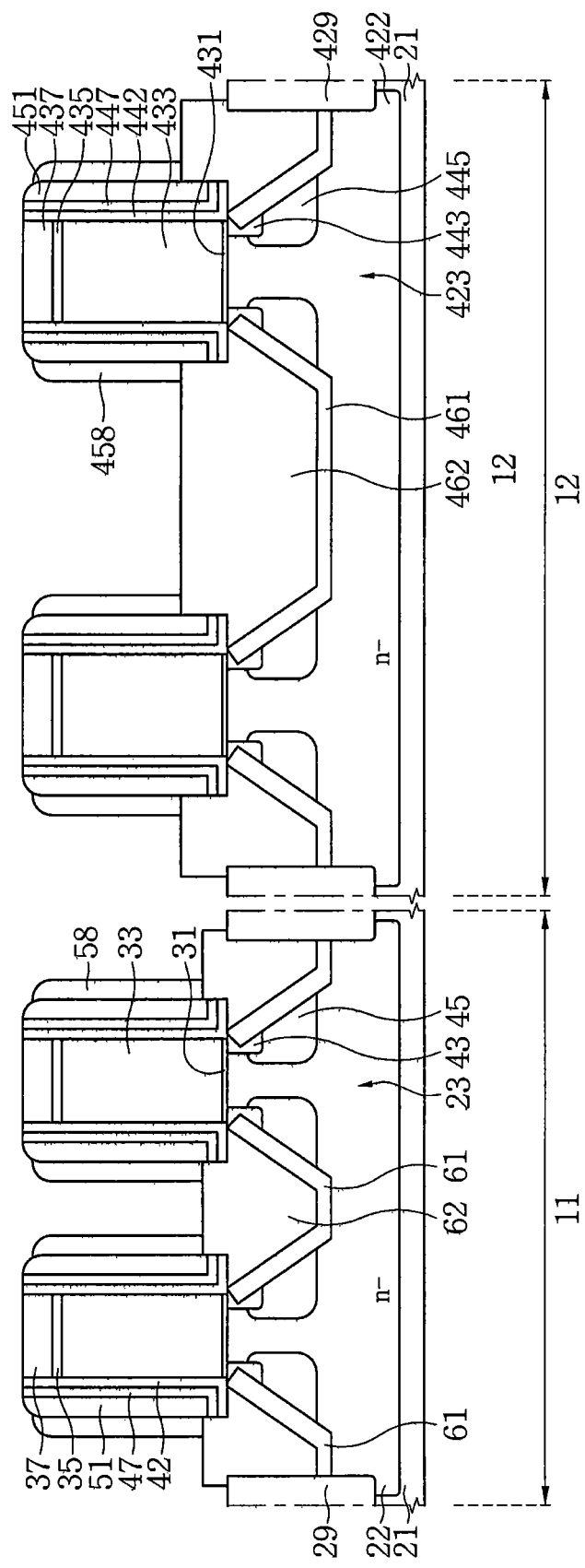

Referring to FIG. 26, a first additional spacer 58 on the first outer spacer 51, and a second additional spacer 458 on the second outer spacer 451 may be formed. The first additional spacer 58 and the second additional spacer 458 may include a material absent from the first outer spacer 51 and the second outer spacer 451. For example, the first outer spacer 51 and the second outer spacer 451 may include silicon nitride, and the first additional spacer 58 and the second additional spacer 458 may include silicon oxide.

The formation of the first additional spacer 58 and the second additional spacer 458 may include a thin-film formation process and an anisotropic etching process. The first additional spacer 58 may partially cover the upper end of the first intermediate semiconductor layer 62. A bottom of the first additional spacer 58 may be in contact with an upper surface of the first intermediate semiconductor layer 62. The second additional spacer 458 may partially cover the upper end of the second intermediate semiconductor layer 462. A bottom of the second additional spacer 458 may be in contact with an upper surface of the second intermediate semiconductor layer 462.

Figure 27:
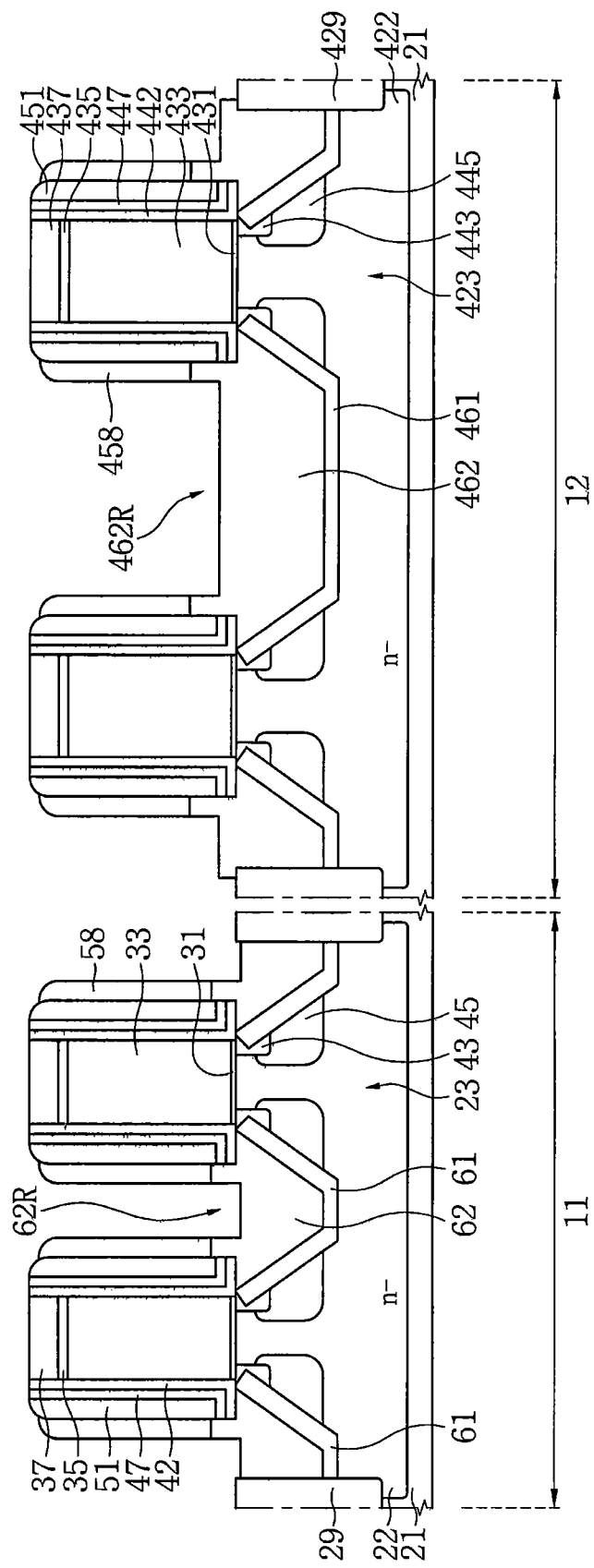

Referring to FIG. 27, the first intermediate semiconductor layer 62 may be partially removed to form a first recess area 62R, and the second intermediate semiconductor layer 462 may be partially removed to form a second recess area 462R. A horizontal width of the first recess area 62R may be smaller than a horizontal width of the second recess area 462R.

Figure 28:
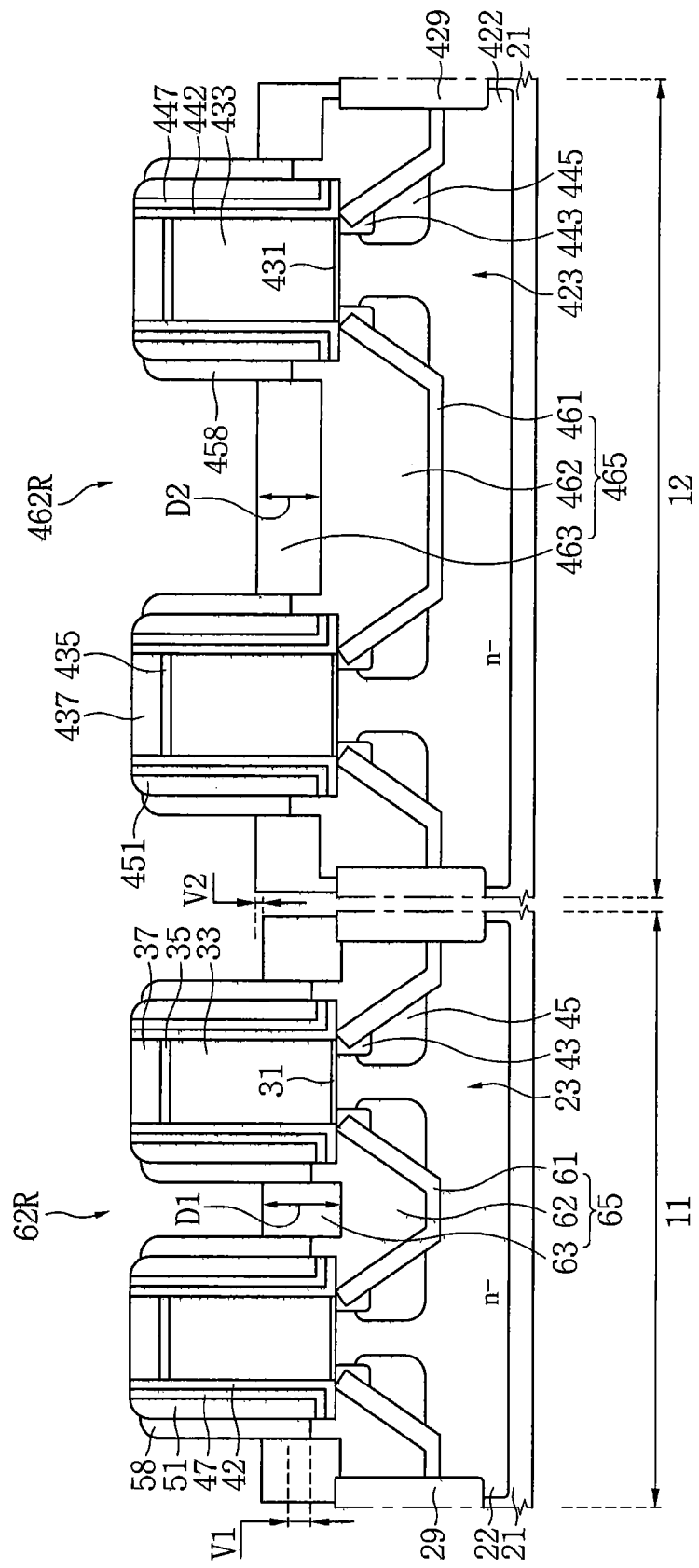

Referring to FIG. 28, a first upper semiconductor layer 63 may be formed on the first intermediate semiconductor layer 62, and a second upper semiconductor layer 463 may be formed on the second intermediate semiconductor layer 462. The first upper semiconductor layer 63 and the second upper semiconductor layer 463 may include boron-doped single crystalline silicon formed by an SEG process. The first lower semiconductor layer 61, the first intermediate semiconductor layer 62, and the first upper semiconductor layer 63 may form a first embedded stressor 65. The second lower semiconductor layer 461, the second intermediate semiconductor layer 462, and the second upper semiconductor layer 463 may form a second embedded stressor 465.

The first upper semiconductor layer 63 may fill the first recess area 62R and protrude from the first recess area 62R. The first upper semiconductor layer 63 may have a first thickness D1. The second upper semiconductor layer 463 may fill the second recess area 462R and protrude from the second recess area 462R. The second upper semiconductor layer 463 may have a second thickness D2. In some embodiments, the first intermediate semiconductor layer 62 may be formed at a growth rate greater than a growth rate of the second upper semiconductor layer 463 when the horizontal width of the first recess area 62R is narrower than that of the second recess area 462R. The first thickness D1 of the first upper semiconductor layer 63 may be greater than the second thickness D2 of the second upper semiconductor layer 463.

A distance between an upper end of the first upper semiconductor layer 63 and an upper end of the second upper semiconductor layer 463 may be defined as a second vertical distance V2. A distance between the upper end of the first intermediate semiconductor layer 62 and the upper end of the second intermediate semiconductor layer 462 may be defined as a first vertical distance V1. The second vertical distance V2 may be smaller than the first vertical distance V1. Accordingly, a vertical distance between an upper end of the first embedded stressor 65 and an upper end of the second embedded stressor 465 may be reduced or minimized.

Figure 29A:
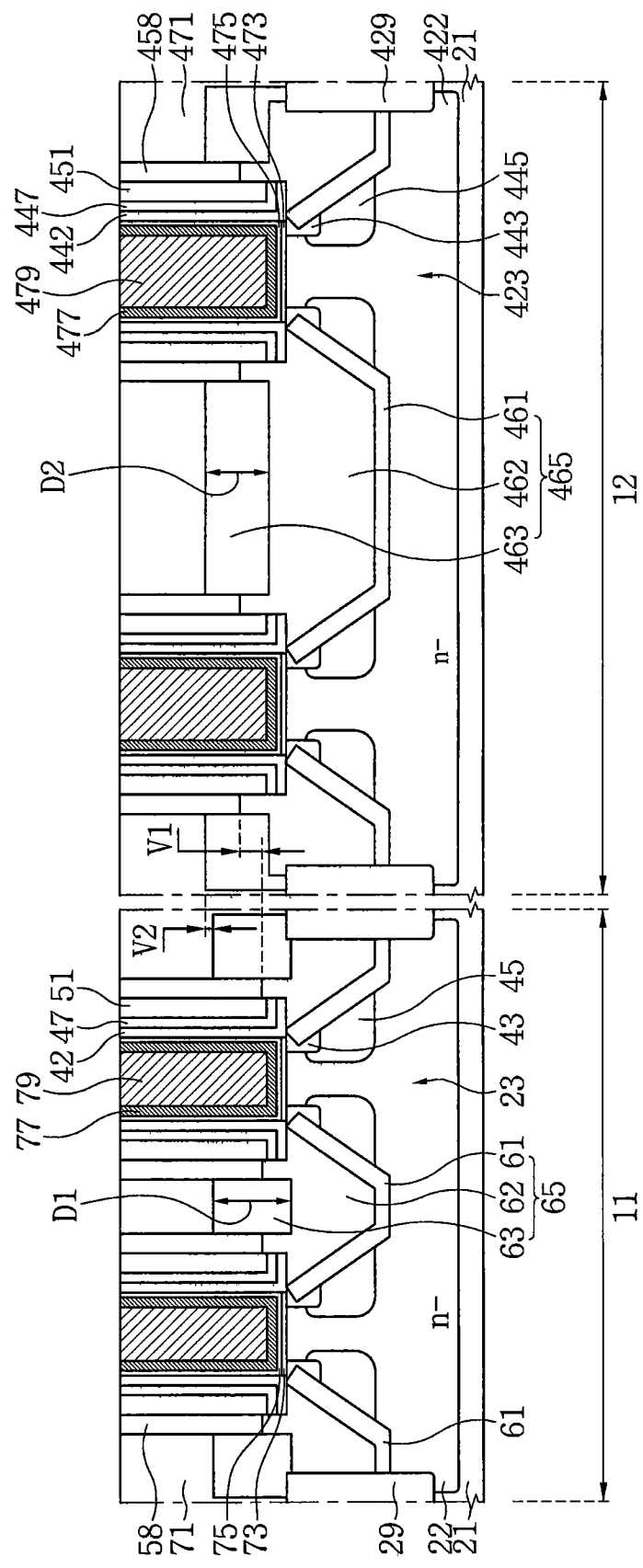

Referring to FIG. 29A, the first interlayer insulating layer 71 and the second interlayer insulating layer 471 may be formed on the substrate 21. The first preliminary gate pattern 31, 33, 35, and 37 may be removed to expose the first active region 23, and the second preliminary gate pattern 431, 433, 435, and 437 may be removed to expose the second active region 423.

A first gate dielectric layer 73, a second gate dielectric layer 75, a first gate electrode 77, and a second gate electrode 79 may be formed on the first active region 23. A third gate dielectric layer 473, a fourth gate dielectric layer 475, a third gate electrode 477, and a fourth gate electrode 479 may be formed on the second active region 423. The third gate dielectric layer 473 may have a similar configuration to that of the first gate dielectric layer 73. The fourth gate dielectric layer 475 may have a similar configuration to that of the second gate dielectric layer 75. The third gate electrode 477 may have a similar configuration to that of the first gate electrode 77. The fourth gate electrode 479 may have a similar configuration to that of the second gate electrode 79.

Figure 29B:
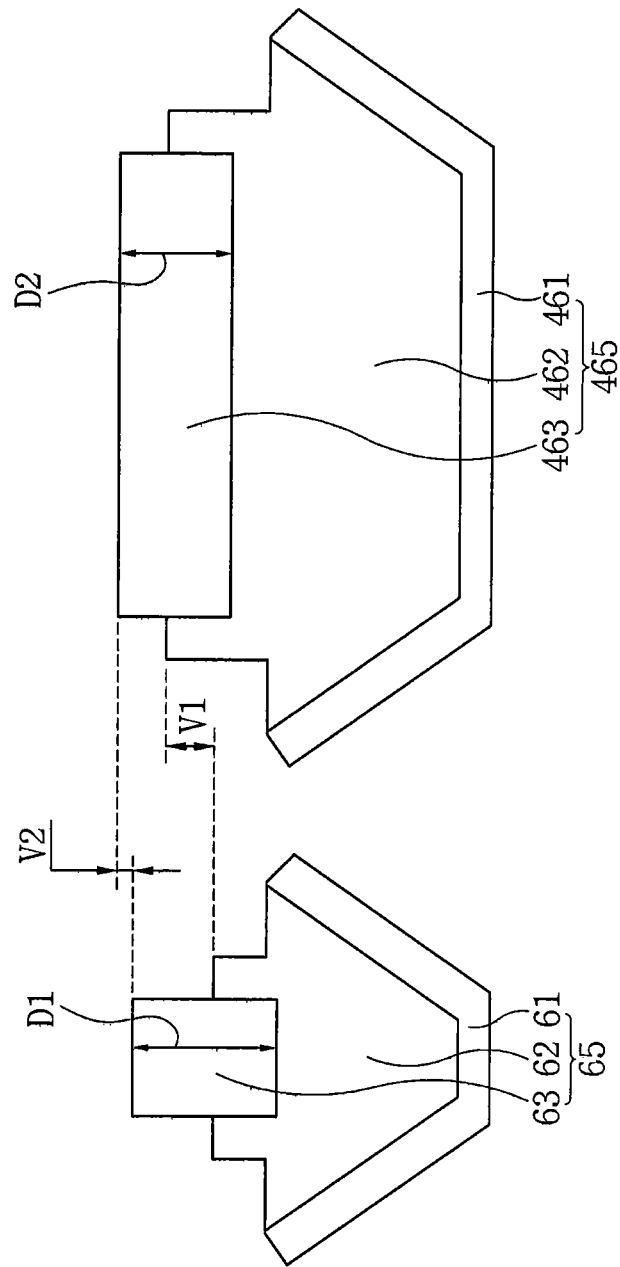

Referring to FIG. 29B, the first embedded stressor 65 may include the first lower semiconductor layer 61, the first intermediate semiconductor layer 62, and the first upper semiconductor layer 63. The second embedded stressor 465 may include the second lower semiconductor layer 461, the second intermediate semiconductor layer 462, and the second upper semiconductor layer 463.

The horizontal width of the first upper semiconductor layer 63 may be smaller than that of the second upper semiconductor layer 463. A lower end of the first upper semiconductor layer 63 may be formed at a lower level than the upper end of the first intermediate semiconductor layer 62. The first intermediate semiconductor layer 62 may be in contact with a side and a bottom of the first upper semiconductor layer 63. The first thickness D1 of the first upper semiconductor layer 63 may be greater than the second thickness D2 of the second upper semiconductor layer 463. A distance between the upper end of the first intermediate semiconductor layer 62 and the upper end of the second intermediate semiconductor layer 462 may be the first vertical distance V1. A distance between the upper end of the first upper semiconductor layer 63 and the upper end of the second upper semiconductor layer 463 may be the second vertical distance V2. The second vertical distance V2 may be smaller than the first vertical distance V1. Accordingly, a vertical distance between the upper end of the first embedded stressor 65 and the upper end of the second embedded stressor 465 may be reduced or minimized. Positions of the upper ends of the first embedded stressor 65 and the second embedded stressor 465 may be controlled.

FIGS. 30-33, 34A and 34B are cross-sectional views illustrating intermediate structures provided in operations of forming a semiconductor device according to some embodiments of the present inventive concepts.

Figure 30:
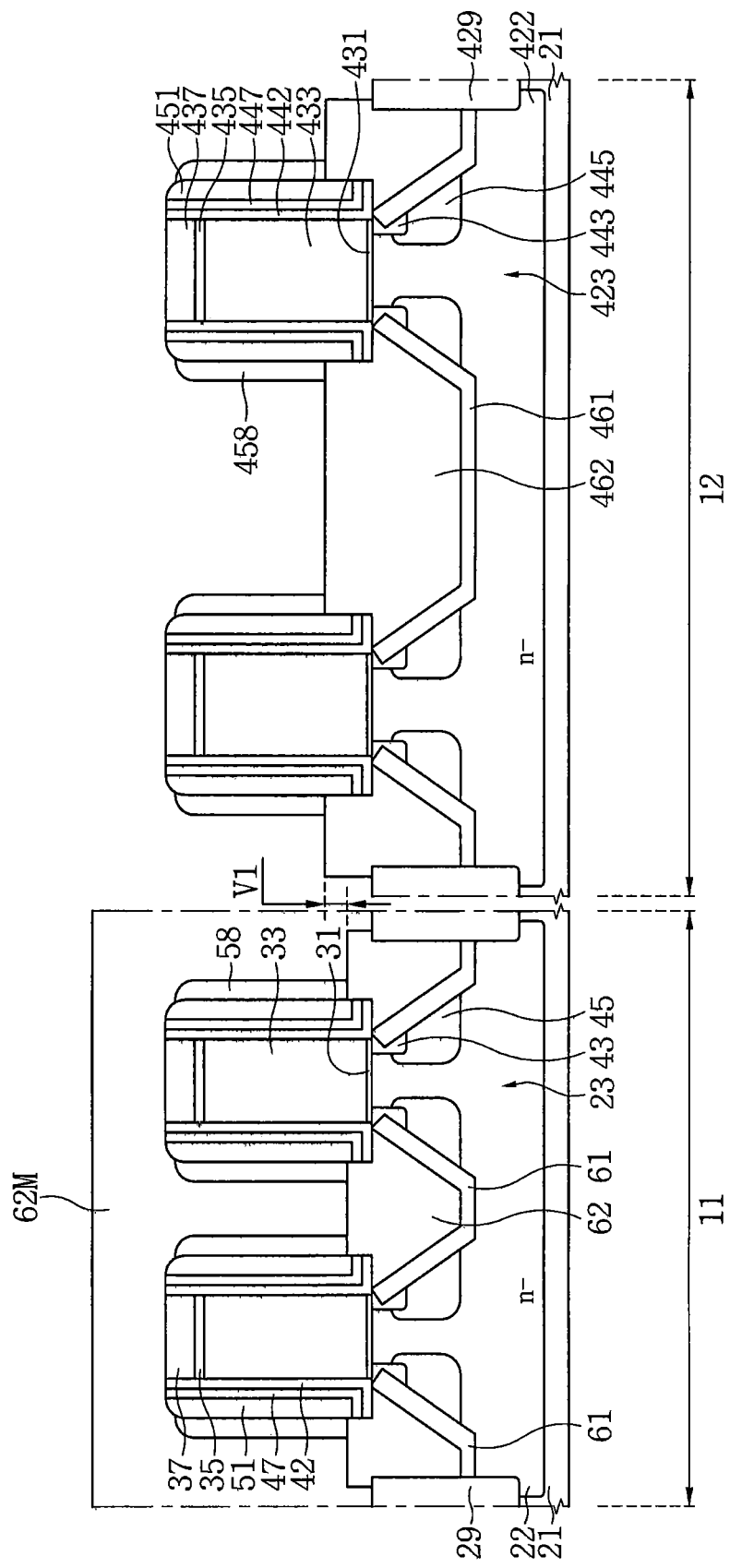
FIGS. 30-33, 34A and 34B are cross-sectional views illustrating intermediate structures provided in operations of forming a semiconductor device according to some embodiments of the present inventive concepts.

Referring to FIG. 30, a third mask pattern 62M covering the first region 11 and exposing the second region 12 may be formed on the substrate 21. The third mask pattern 62M may be formed using a photolithography process. The first intermediate semiconductor layer 62 may be covered by the third mask pattern 62M, and the second intermediate semiconductor layer 462 may be exposed. An upper end of the second intermediate semiconductor layer 462 may be formed at a higher level than an upper end of the first intermediate semiconductor layer 62. A distance between the upper end of the first intermediate semiconductor layer 62 and the upper end of the second intermediate semiconductor layer 462 may be a first vertical distance V1.

Figure 31:
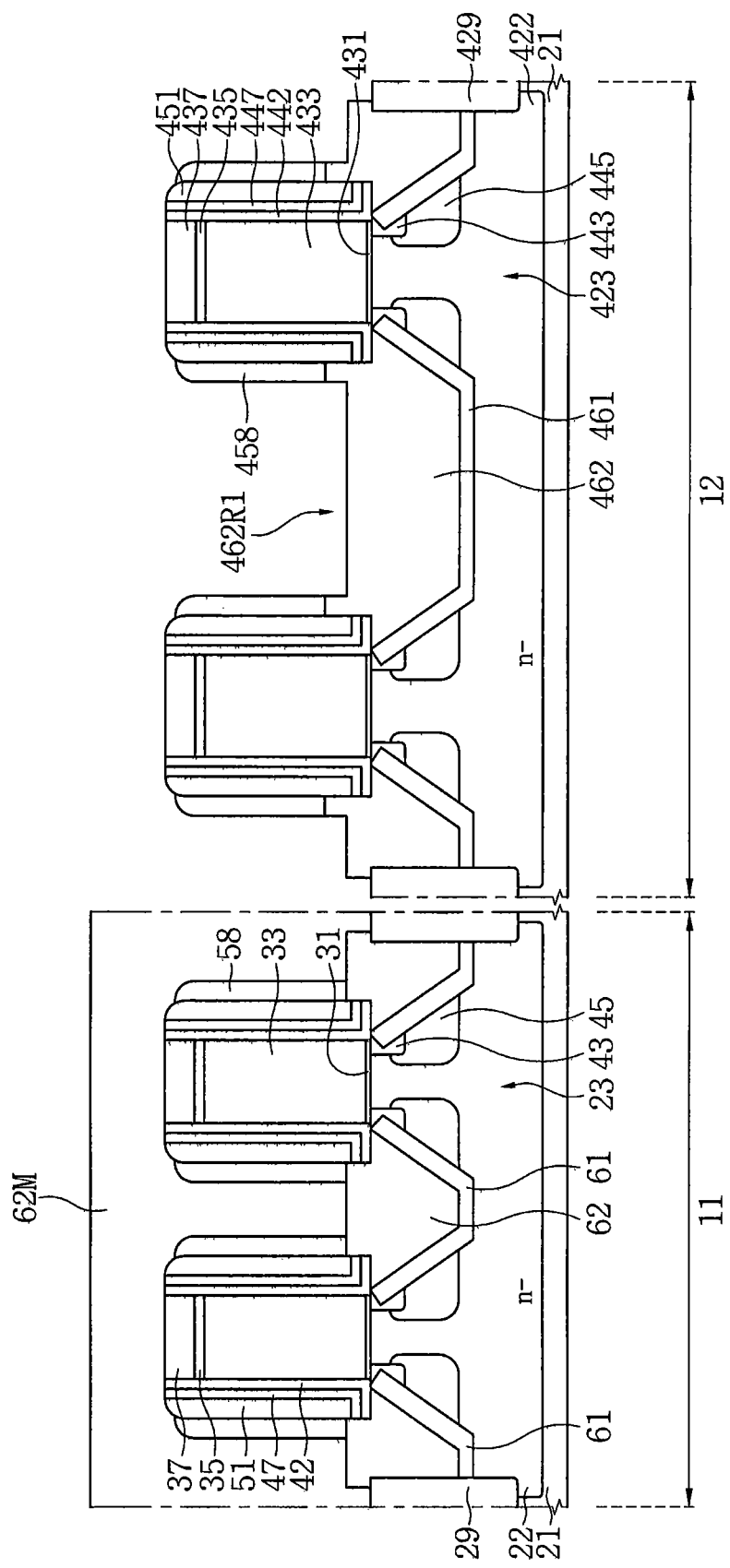

Referring to FIG. 31, a preliminary recess area 462R1 may be formed by partially removing the second intermediate semiconductor layer 462 using the third mask pattern 62M and the second additional spacer 458 as an etch mask. A bottom of the preliminary recess area 462R1 may be formed at a similar level to the upper end of the first intermediate semiconductor layer 62. The third mask pattern 62M may be removed after forming the preliminary recess area 462R1. In some embodiments, the bottom of the preliminary recess area 462R1 may be formed at a lower level than the upper end of the first intermediate semiconductor layer 62.

Figure 32:
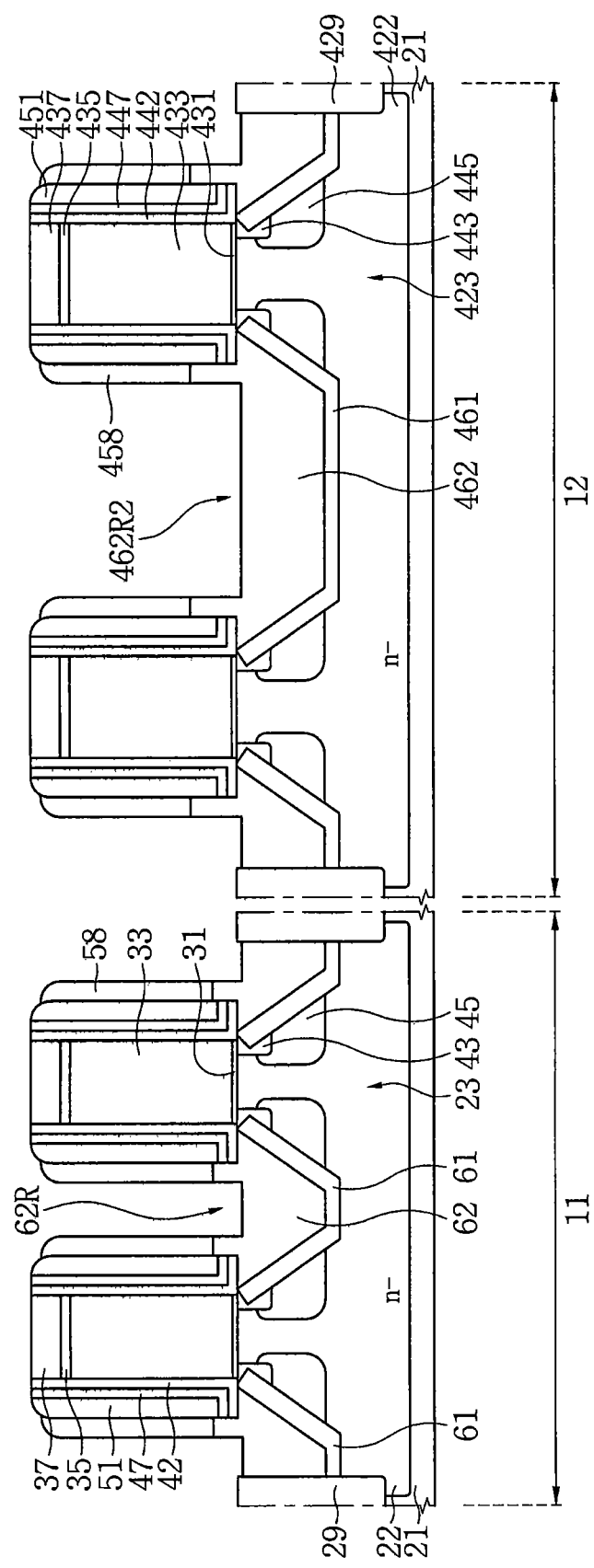

Referring to FIG. 32, the first intermediate semiconductor layer 62 may be partially removed to form a first recess area 62R. During the formation of the first recess area 62R, the second intermediate semiconductor layer 462 exposed in the preliminary recess area 462R1 may also be partially removed to form a second recess area 462R2. The horizontal width of the first recess area 62R may be smaller than that of the second recess area 462R2.

Figure 33:
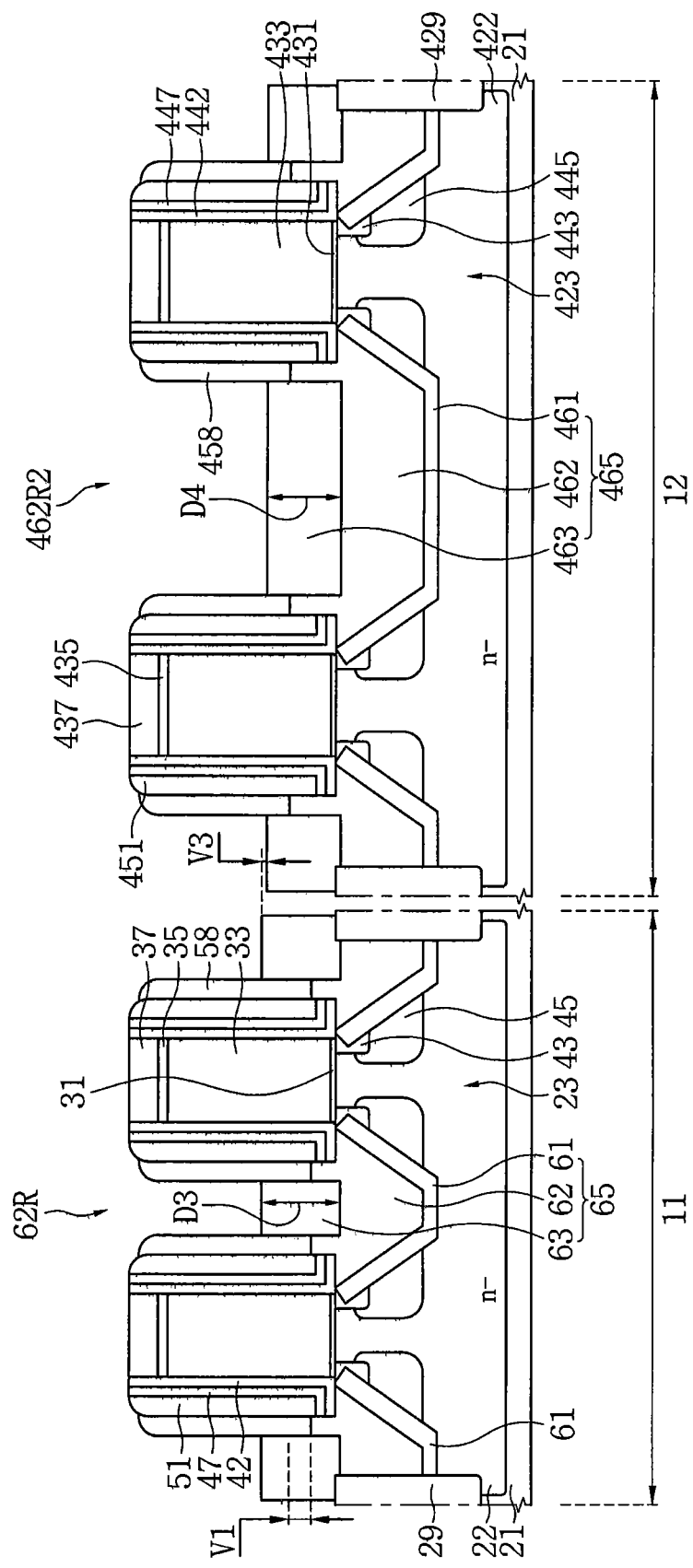

Referring to FIG. 33, a first upper semiconductor layer 63 may be formed on the first intermediate semiconductor layer 62, and a second upper semiconductor layer 463 may be formed on the second intermediate semiconductor layer 462. The first upper semiconductor layer 63 and the second upper semiconductor layer 463 may include boron-doped single crystalline silicon formed by an SEG process. The first lower semiconductor layer 61, the first intermediate semiconductor layer 62, and the first upper semiconductor layer 63 may form a first embedded stressor 65. The second lower semiconductor layer 461, the second intermediate semiconductor layer 462, and the second upper semiconductor layer 463 may form a second embedded stressor 465.

The first upper semiconductor layer 63 may fill the first recess area 62R and protrude from the first recess area 62R. The first upper semiconductor layer 63 may have a third thickness D3. The second upper semiconductor layer 463 may fill the second recess area 462R2 and protrude from the second recess area 462R2. The second upper semiconductor layer 463 may have a fourth thickness D4. In some embodiments, if the horizontal width of the first recess area 62R is narrower than that of the second recess area 462R, the first intermediate semiconductor layer 62 may be formed at a growth rate greater than a growth rate of the second upper semiconductor layer 463. The third thickness D3 of the first upper semiconductor layer 63 may be greater than the fourth thickness D4 of the second upper semiconductor layer 463. The upper end of the second upper semiconductor layer 463 may be formed at a lower level than that of the first upper semiconductor layer 63.

The distance between the upper end of the first upper semiconductor layer 63 and the upper end of the second upper semiconductor layer 463 may be a third vertical distance V3. The distance between the upper end of the first intermediate semiconductor layer 62 and the upper end of the second intermediate semiconductor layer 462 may be the first vertical distance V1. The third vertical distance V3 may be smaller than the first vertical distance V1. Accordingly, a vertical distance between the upper end of the first embedded stressor 65 and the upper end of the second embedded stressor 465 may be reduced or minimized. Upper levels of the first embedded stressor 65 and the second embedded stressor 465 may be controlled.

Figure 34A:
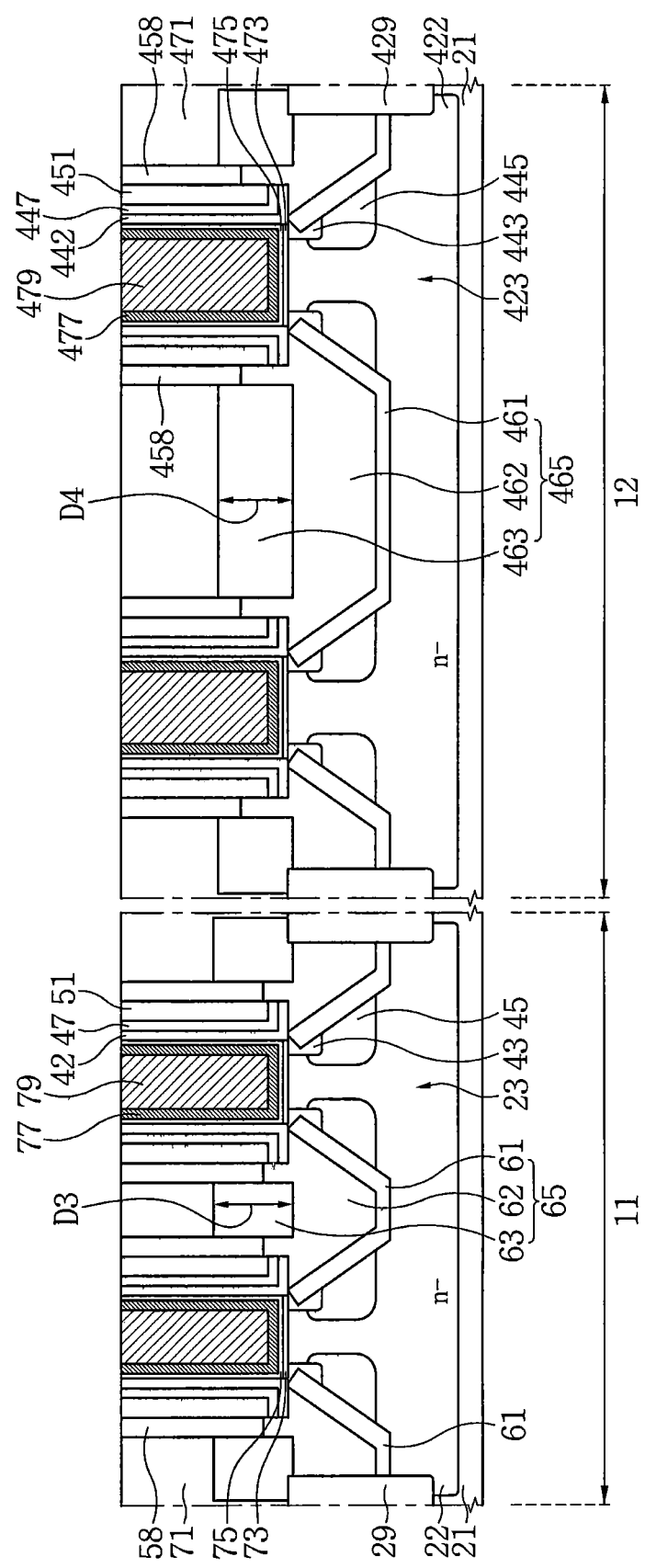

Referring to FIG. 34A, a first interlayer insulating layer 71 and a second interlayer insulating layer 471 may be formed on the substrate 21. The first preliminary gate pattern 31, 33, 35, and 37 may be removed to expose the first active region 23, and the second preliminary gate pattern 431, 433, 435, and 437 may be removed to expose the second active region 423.

A first gate dielectric layer 73, a second gate dielectric layer 75, a first gate electrode 77, and a second gate electrode 79 may be formed on the first active region 23. A third gate dielectric layer 473, a fourth gate dielectric layer 475, a third gate electrode 477, and a fourth gate electrode 479 may be formed on the second active region 423. The third gate dielectric layer 473 may have a configuration similar to that of the first gate dielectric layer 73. The fourth gate dielectric layer 475 may have a configuration similar to that of the second gate dielectric layer 75. The third gate electrode 477 may have a configuration similar to that of the first gate electrode 77. The fourth gate electrode 479 may have a configuration similar to that of the second gate electrode 79.

Figure 34B:
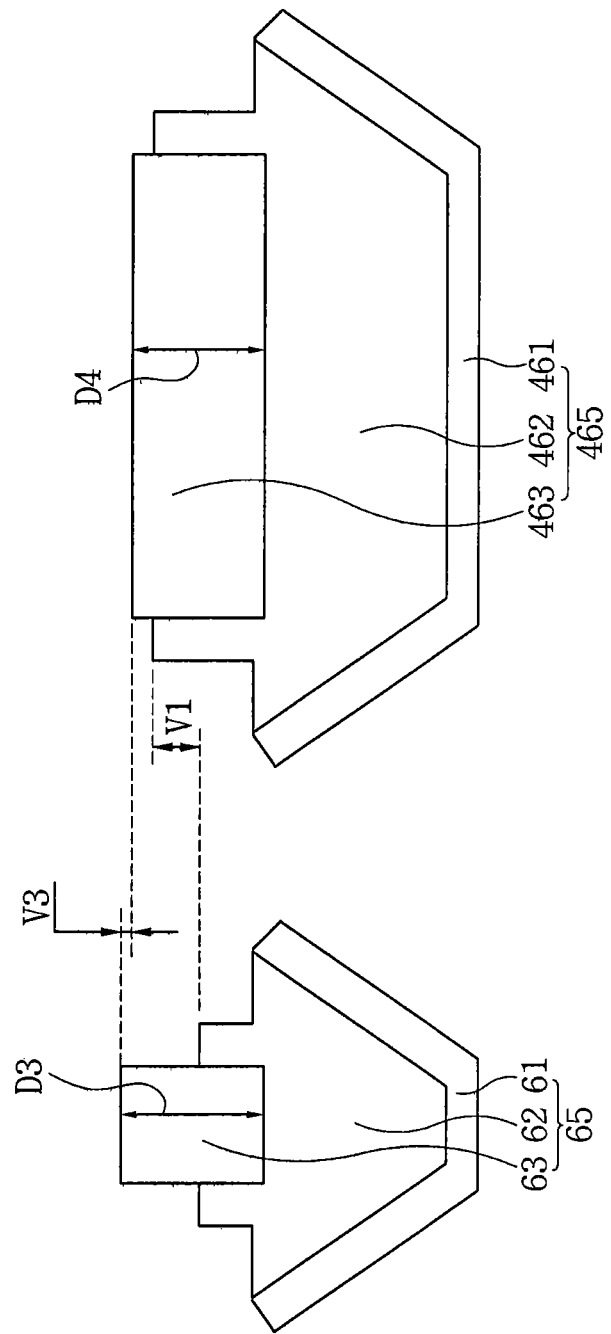

Referring to FIG. 34B, the first embedded stressor 65 may include the first lower semiconductor layer 61, the first intermediate semiconductor layer 62, and the first upper semiconductor layer 63. The second embedded stressor 465 may include the second lower semiconductor layer 461, the second intermediate semiconductor layer 462, and the second upper semiconductor layer 463.

The horizontal width of the first upper semiconductor layer 63 may be smaller than that of the second upper semiconductor layer 463. A lower end of the first upper semiconductor layer 63 may be formed at a lower level than an upper end of the first intermediate semiconductor layer 62. The first intermediate semiconductor layer 62 may be in contact with a side and a bottom of the first upper semiconductor layer 63. The third thickness D3 of the first upper semiconductor layer 63 may be greater than the fourth thickness D4 of the second upper semiconductor layer 463. The distance between the upper end of the first intermediate semiconductor layer 62 and the upper end of the second intermediate semiconductor layer 462 may be a first vertical distance V1. The distance between the upper end of first upper semiconductor layer 63 and the upper end of second upper semiconductor layer 463 may be a third vertical distance V3. The third vertical distance V3 may be smaller than the first vertical distance V1. Accordingly, a vertical distance between the upper end of the first embedded stressor 65 and the upper end of the second embedded stressor 465 may be reduced or minimized. Positions of the upper ends of the first embedded stressor 65 and the second embedded stressor 465 may be controlled.

Figure 35:
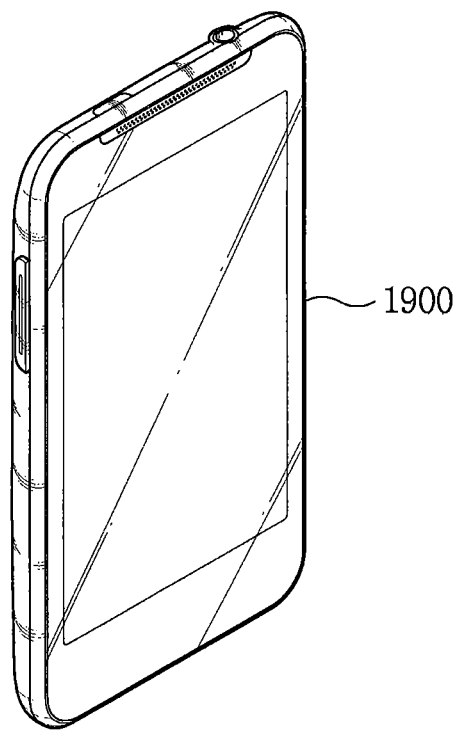
FIGS. 35 and 36 are a perspective view and a block diagram of an electronic apparatus, respectively, according to some embodiments of the present inventive concepts.
Figure 36:
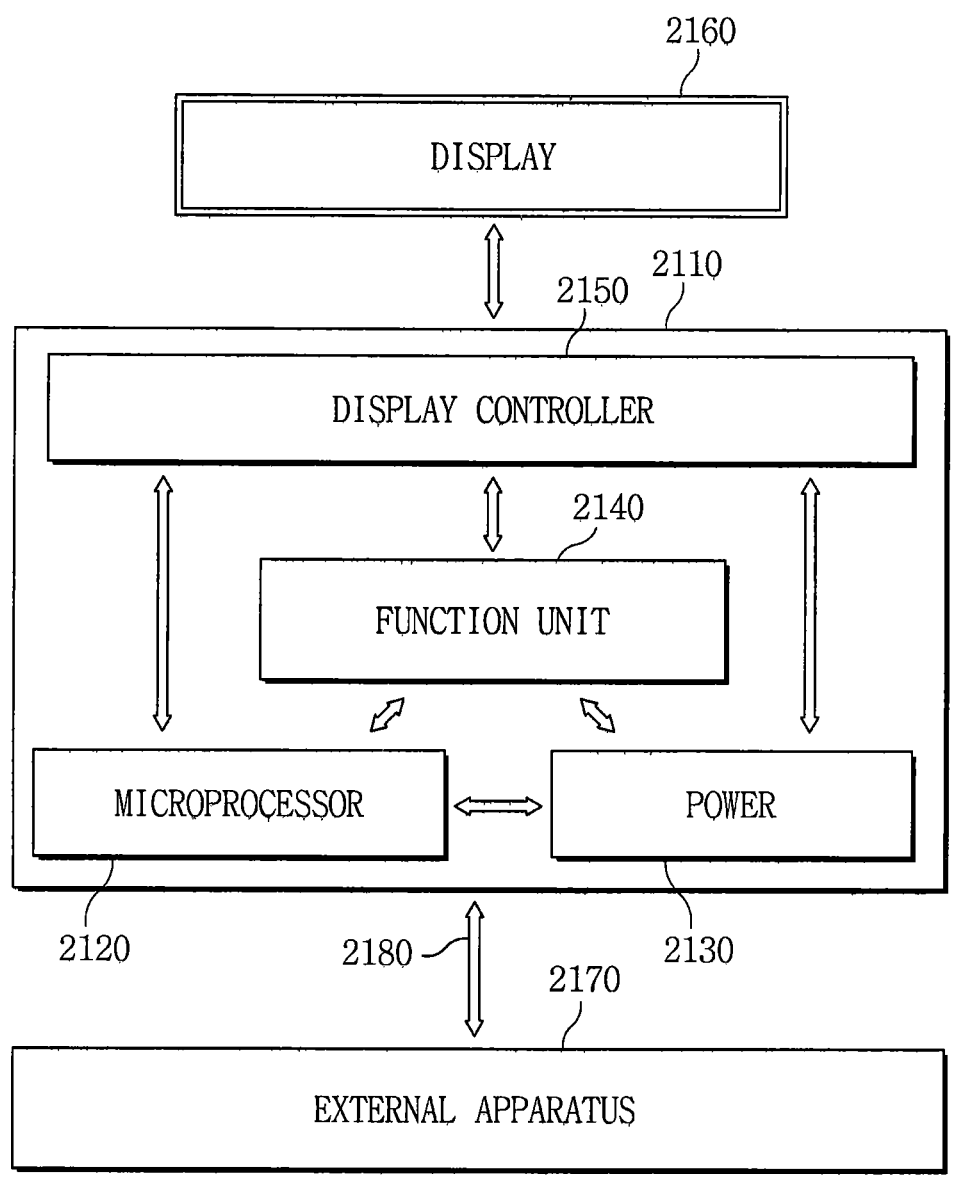

FIGS. 35 and 36 are a perspective view and a block diagram of an electronic apparatus, respectively, according to some embodiments of the present inventive concepts. Referring to FIG. 35, a semiconductor device according to some embodiments of the present inventive concepts may be applied to electronic systems such as a smart phone 1900, a netbook, a notebook, or a tablet PC. For example, the semiconductor device according to some embodiments may be installed in a main board of the smart phone 1900. Further, the semiconductor device according to some embodiments may be provided to an expansion apparatus such as an external memory card to be combined with the smart phone 1900.

Referring to FIG. 36, a semiconductor device according to some embodiments of the present inventive concepts may be applied to an electronic system 2100. The electronic system 2100 may include a body 2110, a microprocessor unit 2120, a power unit 2130, a function unit 2140, and/or a display controller unit 2150. The body 2110 may be a motherboard formed of a printed circuit board (PCB). The microprocessor unit 2120, the power unit 2130, the function unit 2140, and the display controller unit 2150 may be mounted or installed on the body 2110. A display unit 2160 may be arranged inside or outside of the body 2110. For example, the display unit 2160 may be arranged on a surface of the body 2110 and display an image processed by the display controller unit 2150.

The power unit 2130 may receive a constant voltage from an external battery, etc., divide the voltage into various levels, and supply those voltages to the microprocessor unit 2120, the function unit 2140, and the display controller unit 2150, etc. The microprocessor unit 2120 may receive a voltage from the power unit 2130 to control the function unit 2140 and the display unit 2160. The function unit 2140 may perform various functions of the electronic system 2100. For example, when the electronic system 2100 is a smart phone, the function unit 2140 may have several components which can perform wireless communication functions such as output of an image to the display unit 2160 or output of a voice to a speaker, by dialing or communication with an external apparatus 2170. If a camera is installed, the function unit 2140 may function as an image processor.

According to some embodiments of the present inventive concepts, when the electronic system 2100 is connected to a memory card, etc. in order to expand capacity, the function unit 2140 may be a memory card controller. The function unit 2140 may exchange signals with the external apparatus 2170 through a wired or wireless communication unit 2180. In addition, when the electronic system 2100 needs a universal serial bus (USB), etc. in order to expand functionality, the function unit 2140 may function as an interface controller. Further, the function unit 2140 may include a mass storage apparatus.

The semiconductor device according to some embodiments of the present inventive concepts may be applied to the function unit 2140 or the microprocessor unit 2120. For example, the microprocessor unit 2120 may include the embedded stressor 65. The microprocessor unit 2120 may have good electrical characteristics due to the configuration of the embedded stressor 65.

Figure 37:
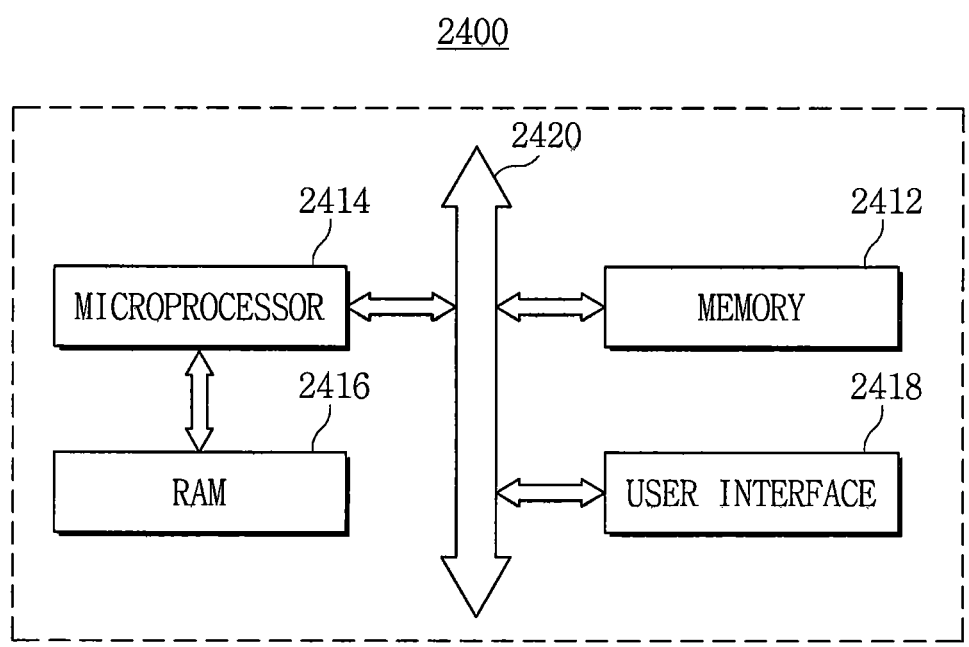
FIG. 37 is a block diagram of an electronic system according to some embodiments of the present inventive concepts.

FIG. 37 is a block diagram of an electronic system according to some embodiments of the present inventive concepts.

Referring to FIG. 37, the electronic system 2400 may include at least one of semiconductor devices according to some embodiments. The electronic system 2400 may be used to fabricate a mobile apparatus or a computer. For example, the electronic system 2400 may include a memory system 2412, a microprocessor 2414, a random access memory (RAM) 2416, a bus 2420, and a user interface 2418. The microprocessor 2414, the memory system 2412, and the user interface 2418 may be connected each other via the bus 2420. The user interface 2418 may be used to input/output data to/from the electronic system 2400. The microprocessor 2414 may program and control the electronic system 2400. The RAM 2416 may be used as an operation memory of the microprocessor 2414. The microprocessor 2414, the RAM 2416, and/or other components may be assembled in a single package. The memory system 2412 may store codes for operating the microprocessor 2414, data processed by the microprocessor 2414, or external input data. The memory system 2412 may include a controller and a memory.

The microprocessor 2414, the RAM 2416, or the memory system 2412 may include the semiconductor device according to some embodiments. For example, the microprocessor 2414 may include the embedded stressor 65. The microprocessor 2414 may have good electrical characteristics due to the configuration of the embedded stressor 65.

Semiconductor devices according to some embodiments may include an embedded stressor filling a trench formed in an active region. The formation of the trench may include forming a faster etch rate part by implanting phosphorous in an LDD, forming a first trench by isotropically etching the faster etch rate part, and forming a second trench using a directional etch process. The embedded stressor may fill the trench. Semiconductor devices according to some embodiments may have good electrical characteristics because the control of a size, a shape, and a position of the embedded stressor may be easy or improved, the pattern-loading effect may be reduced or minimized, and variation according to the position of the active region between the center area and an edge area may be reduced.

The above-disclosed subject matter is to be considered illustrative, and not restrictive, and the appended claims are intended to cover all such modifications, enhancements, and other embodiments, which fall within the true spirit and scope of the inventive concepts. Thus, to the maximum extent allowed by law, the scope is to be determined by the broadest permissible interpretation of the following claims and their equivalents, and shall not be restricted or limited by the foregoing detailed description.

What is claimed is:

1. A method of forming a semiconductor device, the method comprising:
   forming a lightly doped drain (LDD) in an active region in a substrate;
   forming a fast etching region comprising phosphorous in the LDD;
   forming a first trench in the active region by recessing the fast etching region;
   forming a second trench in the active region by enlarging the first trench using a directional etch process, wherein the second trench comprises a notched portion of the active region;
   forming an embedded stressor in the second trench; and
   forming a gate electrode on the active region,
   wherein the embedded stressor comprises a lower semiconductor layer and an upper semiconductor layer,
   wherein the upper semiconductor layer comprises a first width narrower than a second width of the lower semiconductor layer, and alignment of a side surface of the upper semiconductor layer is offset from an outer side surface of the lower semiconductor layer, and
   wherein an uppermost surface of the upper semiconductor layer is higher than an uppermost surface of the active region.

2. The method of claim 1, further comprising:
   forming a spacer between the upper semiconductor layer and the gate electrode, wherein the spacer contacts an uppermost surface of the lower semiconductor layer and a side of the upper semiconductor layer.

3. The method of claim 1, wherein forming the lower semiconductor layer comprises:
   forming a first semiconductor layer in the second trench; and
   forming a second semiconductor layer on the first semiconductor layer,
   wherein the second semiconductor layer comprises boron and germanium, and a germanium concentration of the second semiconductor layer is greater than a germanium concentration of the first semiconductor layer.

4. The method of claim 1, wherein a portion of the fast etching region is between the LDD and the embedded stressor, after forming the embedded stressor.

5. The method of claim 2, wherein forming the embedded stressor comprises:
   forming the lower semiconductor layer in the second trench;
   forming the spacer on the lower semiconductor layer; and
   forming the upper semiconductor layer contacting a side of the spacer on the lower semiconductor layer.

6. The method of claim 5, further comprising:
   forming a recess in the lower semiconductor layer before forming the upper semiconductor layer, wherein forming the recess comprises etching the lower semiconductor layer using the spacer as an etch mask, and wherein at least a portion of the upper semiconductor layer is in the recess.

7. The method of claim 3, wherein forming the first semiconductor layer, the second semiconductor layer, and the upper semiconductor layer comprises performing at least one selective epitaxial growth (SEG) process.

8. A method of forming a semiconductor device, the method comprising:
   forming a first gate electrode on a first active region in a first region of a substrate and a second gate electrode on a second active region in a second region of the substrate, wherein the first and second regions comprise different respective pattern densities;
   forming a first spacer on a side of the first gate electrode and a second spacer on a side of the second gate electrode;
   forming a first additional spacer on the first spacer and a second additional spacer on the second spacer;
   forming a first trench in the first active region adjacent the side of the first gate electrode and a second trench in the second active region adjacent the side of the second gate electrode; and
   forming a first embedded stressor in the first trench and a second embedded stressor in the second trench,
   wherein the first embedded stressor comprises a first lower semiconductor layer and a first upper semiconductor layer on the first lower semiconductor layer,
   wherein a lowermost portion of the first upper semiconductor layer is lower than an uppermost surface of the first lower semiconductor layer, wherein the second embedded stressor comprises a second lower semiconductor layer and a second upper semiconductor layer on the second lower semiconductor layer, and wherein the first upper semiconductor layer comprises a first thickness greater than a second thickness of the second upper semiconductor layer.

9. The method of claim 8, wherein a first vertical distance between the uppermost surface of the first lower semiconductor layer and an uppermost surface of the second lower semiconductor layer is greater than a second vertical distance between an uppermost surface of the first upper semiconductor layer and an uppermost surface of the second upper semiconductor layer.

* * * * *